United States Patent
Lu et al.

(10) Patent No.: US 8,549,386 B2
(45) Date of Patent: Oct. 1, 2013

(54) PRE-DECODED TAIL-BITING CONVOLUTIONAL CODE DECODER AND DECODING METHOD THEREOF

(75) Inventors: Ming-Ho Lu, Yunlin County (TW); Chi-Tien Sun, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 321 days.

(21) Appl. No.: 13/049,910

(22) Filed: Mar. 17, 2011

(65) Prior Publication Data

US 2012/0192041 A1 Jul. 26, 2012

(30) Foreign Application Priority Data

Jan. 26, 2011 (TW) .............................. 100102939 A

(51) Int. Cl.
*H03M 13/03* (2006.01)

(52) U.S. Cl.
USPC .......................................... 714/786; 714/796

(58) Field of Classification Search
USPC ................................. 714/786, 796
See application file for complete search history.

(56) References Cited

U.S. PATENT DOCUMENTS

| | | | |
|---|---|---|---|
| 5,355,376 A | | 10/1994 | Cox et al. |
| 5,369,671 A | | 11/1994 | Yehushua et al. |
| 5,875,001 A | * | 2/1999 | Kwak ............................ 348/607 |
| 5,987,637 A | * | 11/1999 | Thomas ........................ 714/795 |
| 6,154,871 A | * | 11/2000 | Claydon et al. ............... 714/795 |
| 2007/0229344 A1 | * | 10/2007 | Meyer et al. .................. 341/161 |
| 2010/0034325 A1 | * | 2/2010 | Abdallah et al. ............... 375/341 |

OTHER PUBLICATIONS

Adballah et al, "Low-Power Pre-Decoding Based Viterbi Decoder for Tail-Biting Convolutional Codes," Signal Processing Systems, IEEE, p. 185-190, Oct. 7-9, 2009.
Chu et al., "Power Efficient Low Latency Survivor Memory Architecture for Viterbi Decoder," VLSI Design, Automation and Test,IEEE,p. 228-231,Apr. 23-25, 2008.
Gang et al., "An Efficient Pre-Traceback Approach for Viterbi Decoding in Wireless Communication," IEEE Transactions on Circuits and Systems—I: Regular Papers, vol. 53, No. 9, p. 5441-5444, Sep. 2006.
Manzoor et al., "VLSI Implementation of an Efficient Pre-Trace Back Approach for Viterbi Algorithm," Proceedings of International Bhurban Conference on Applied Sciences & Technology Islamabad, Pakistan, p. 27-30, Jan. 8-11, 2007.
Shaker et al.,"FPGA Implementation of a Reconfigurable Viterbi Decoder for WiMAX Receiver", 2009 Microelectronics (ICM), 2009 International Conference, IEEE, ,p. 264-267,Dec. 19-22, 2009.

(Continued)

*Primary Examiner* — M. Mujtaba K Chaudry
(74) *Attorney, Agent, or Firm* — Jianq Chyun IP Office

(57) ABSTRACT

A pre-decoded tail-biting convolutional code (TBCC) decoder and a decoding method thereof are provided. The decoder includes a pre-decoder, a storage module, and a control module. The pre-decoder receives a current state, a neighboring state, and a current path status corresponding to sequential data encoded in TBCC, generates predicted decoded bits, and determines whether states corresponding to minimum path metrics of neighboring stages are in continuity according to the current state, the neighboring state, and a current path status. The storage module is connected to the pre-decoder and stores the predicted decoded bits. The control module is connected to the storage module and the pre-decoder. In addition, the control module selects to output the decoded bits from the storage module when the continuity between the states corresponding to the minimum path metrics of the neighboring stages reaches a truncation length.

21 Claims, 14 Drawing Sheets

(56) References Cited

OTHER PUBLICATIONS

Min et al., "Research on an-based Decode of Tail-Biting Convolutional Codes and Their Performance Analyses Used in LTE System", Information Technology and Applications,IEEE,p. 303-306,vol. 2, May 15-17, 2009.

Liu et al., "Trellis Lengths and Truncation Depths for TBCC Decoders in Mobile WiMAX", Intelligent Signal Processing and Communication Systems,IEEE,p. 5-8,Jan. 7-9, 2009.

Lin et al., "Design of a Power-Reduction Viterbi Decoder for WLAN Applications", Circuits and Systems, IEEE, 1148-1156,vol. 52 , Jun. 2005.

Boutillon et al., "High Speed Low Power Architecture for Memory Management in a Viterbi Decoder", 1996 IEEE, p. 284-287.

Wu et al., "VLSI Architecture of Extended In-Place Path Metric Update for Viterbi Decoders", 2001 IEEE, p. IV-206-p. IV-209.

Cox et al.,"An Efficient Adaptive Circular Viterbi Algorithm for Decoding Generalized Tailbiting Convolutional Codes," IEEE Transactions on Vehicular Technology, pp. 57-68, vol. 43, No. 1, Feb. 1994.

* cited by examiner

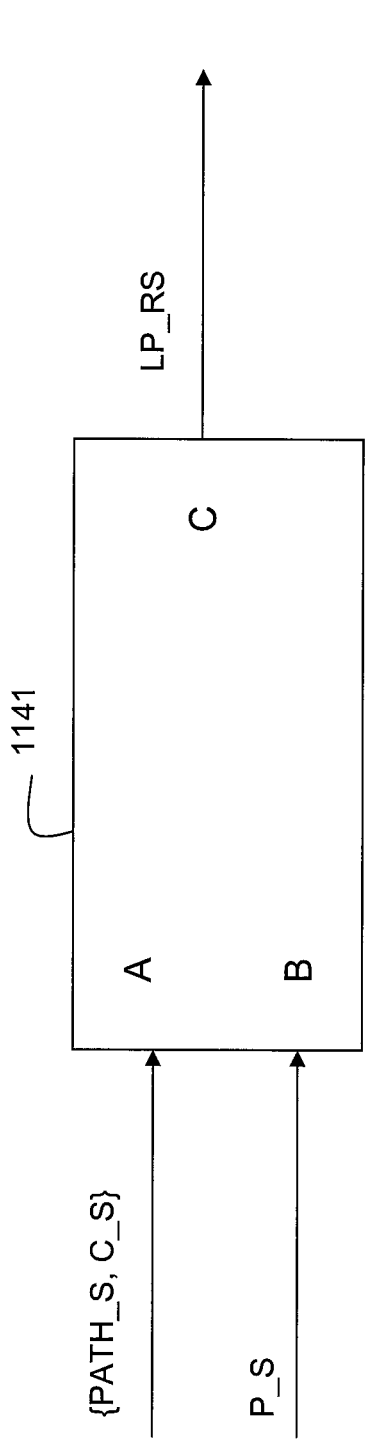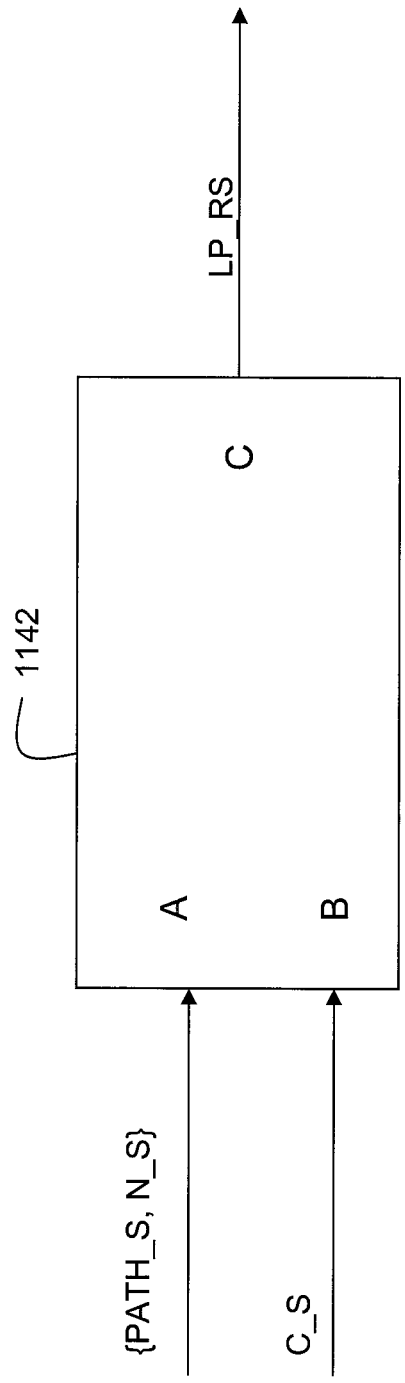

PRE-DECODED TAIL-BITING CONVOLUTIONAL CODE DECODER AND DECODING METHOD THEREOF

CROSS-REFERENCE TO RELATED APPLICATION

This application claims the priority benefit of Taiwan application serial no. 100102939, filed Jan. 26, 2011. The entirety of the above-mentioned patent application is hereby incorporated by reference herein and made a part of this specification.

TECHNICAL FIELD

The disclosure relates to a pre-decoded tail-biting convolutional code (TBCC) decoder and a decoding method thereof.

BACKGROUND

Wireless communication technologies, for example, the Wireless Local Area Network (WLAN) technology, Wireless Personal Area Network (WPAN) technology, and Wireless Wide Area Network (WWAN) technology, mostly use the Orthogonal Frequency Division Multiplexing (OFDM) technology to improve the transmission throughput, and usually adopt a tail-biting convolutional code (TBCC) as an error control code.

In a decoding circuit of the error control code, several methods have been proposed to manage paths related to transferring storage state during a decoding process, but these methods all require a large capacity memory. A TBCC decoder module usually has high power consumption in a wireless communication device, so TBCC demodulation must be well designed. The TBCC decoding methods in the conventional art mainly include following two approaches such as a trace back decoding manner and a trace forward decoding manner.

In the conventional TBCC decoding method, after a receiving end receives a signal, based on a circular property of the TBCC, data in the front part of the TBCC is appended to the back part, and then a convergence stage and an initial state are found by the trace forward manner. Next, the memory stores and decodes a survivor path in each state, and stores and decodes a path metric accumulated at each stage. Finally, a maximum likelihood path is found through comparison, and a decoded correct code is read from the memory.

In addition to finding the convergence level (or a convergence stage) or the initial state in the trace forward manner, in the conventional art, the initial state of the TBCC can also be found by the trace back convergence manner. After the convergence, the data is written in the memory. Finally, the preferred path solution is found by a comparison circuit, and then the decoding process of the convolutional code is controlled by the trace back memory.

However, in the conventional art, when the TBCC is decoded, the large capacity memory may usually required, and this results in a large hardware area and consequent high power consumption. Therefore, it is an important issue to design an error control code digital circuit having high performance and lower power consumption to implement the TBCC decoding process.

SUMMARY

According to an exemplary embodiment, the disclosure provides a pre-decoded TBCC decoder, which is adapted for decoding sequential data encoded in TBCC. The pre-decoded TBCC decoder includes a pre-decoder, a storage module, and a control module. The pre-decoder receives a current state, a neighboring state, and a current path status corresponding to the sequential data, generates at least one predicted decoded bit, and determines whether states corresponding to minimum path metrics of neighboring stages are in continuity according to the neighboring state, the current state, and the current path status. The storage module is connected to the pre-decoder, and stores the at least one predicted decoded bit. The control module is connected to the storage module and the pre-decoder. In addition, when the continuity between the states corresponding to the minimum path metrics of the neighboring stages reaches a truncation length, the control module selects to output the at least one predicted decoded bit from the storage module.

According to another exemplary embodiment, the disclosure provides a pre-decoded TBCC decoding method, which is adapted for decoding sequence data encoded in TBCC. The method includes the following steps. A current state, a neighboring state, and a current path state are received corresponding to the sequential data. At least one predicted decoded bit is generated. It is determined whether states corresponding to minimum path metrics of neighboring stages are in continuity according to the neighboring state, the current state, and the current path status. The at least one predicted decoded bit is stored. In addition, the at least one predicted decoded bit stored previously is selected to be output when the continuity between the states corresponding to the minimum path metrics of the neighboring stages reaches a truncation length.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3A is a functional block diagram of a comparator according to an exemplary embodiment.

FIG. 3B is a functional block diagram of another comparator according to another exemplary embodiment.

DESCRIPTION OF THE EXEMPLARY EMBODIMENTS

Figure 1A:
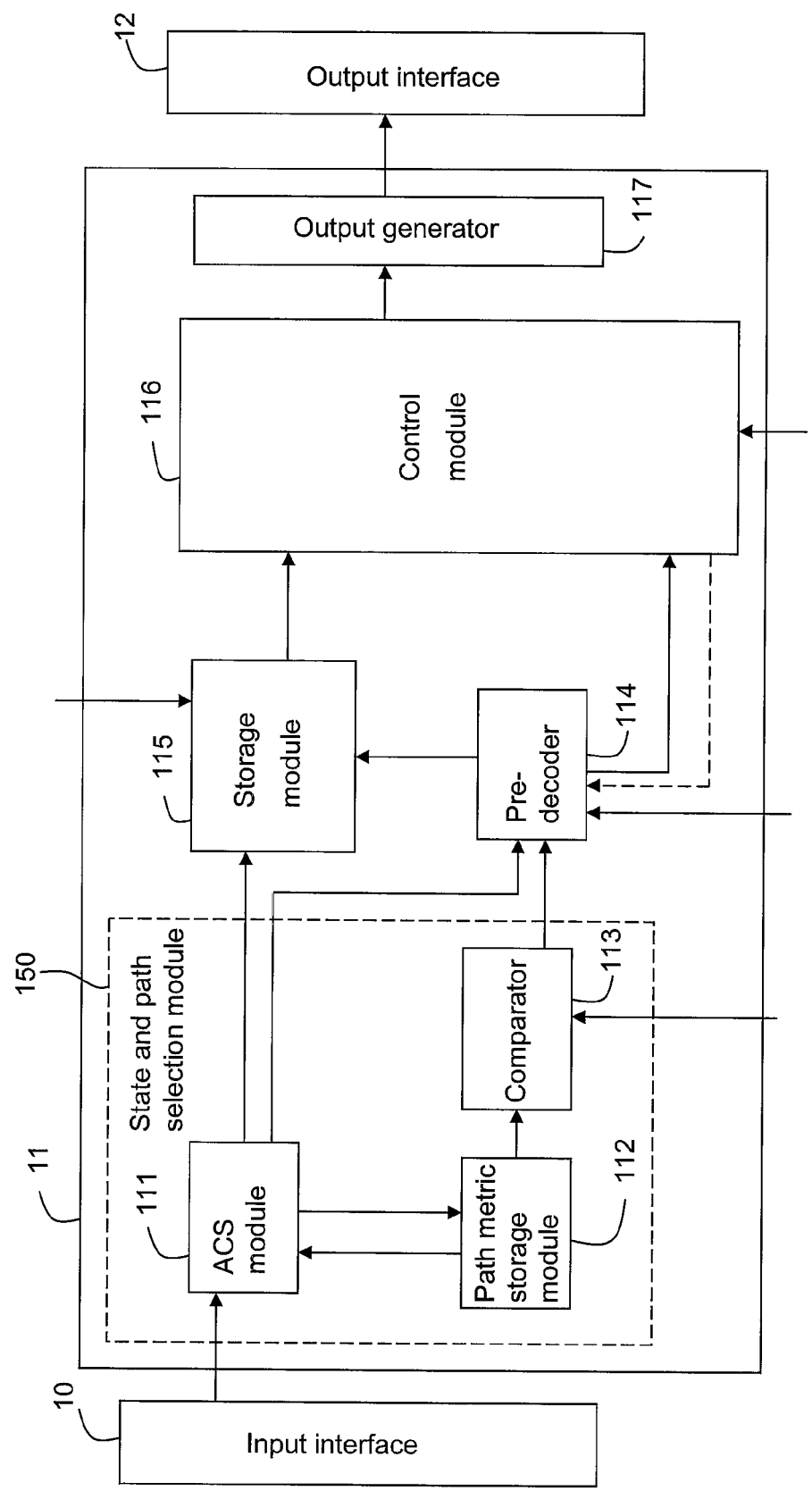
FIG. 1A is a block diagram of a TBCC decoder according to an exemplary embodiment of the disclosure.

Some embodiments of the present application will now be described more fully hereinafter with reference to the accompanying drawings, in which some, but not all embodiments of the application are shown. Indeed, various embodiments of the application may be embodied in many different forms and should not be construed as limited to the embodiments set forth herein; rather, these embodiments are provided so that this disclosure will satisfy applicable legal requirements. Like reference numerals refer to like elements throughout.

The disclosure provides a pre-decoded TBCC decoder (decoder) and a decoding method thereof. In the pre-decoded TBCC decoder, through modifications of architecture design, in which paths of butterfly operation units are reduced, and power consumption is reduced by using a memory configuration area required by relations among a previous state (or a current state), a current state (or a next state), and decoding output of a Viterbi decoder (or output of a convolutional decoder), and procedures of creation of the loop-up table and looking up in the loop-up table.

Figure 4:
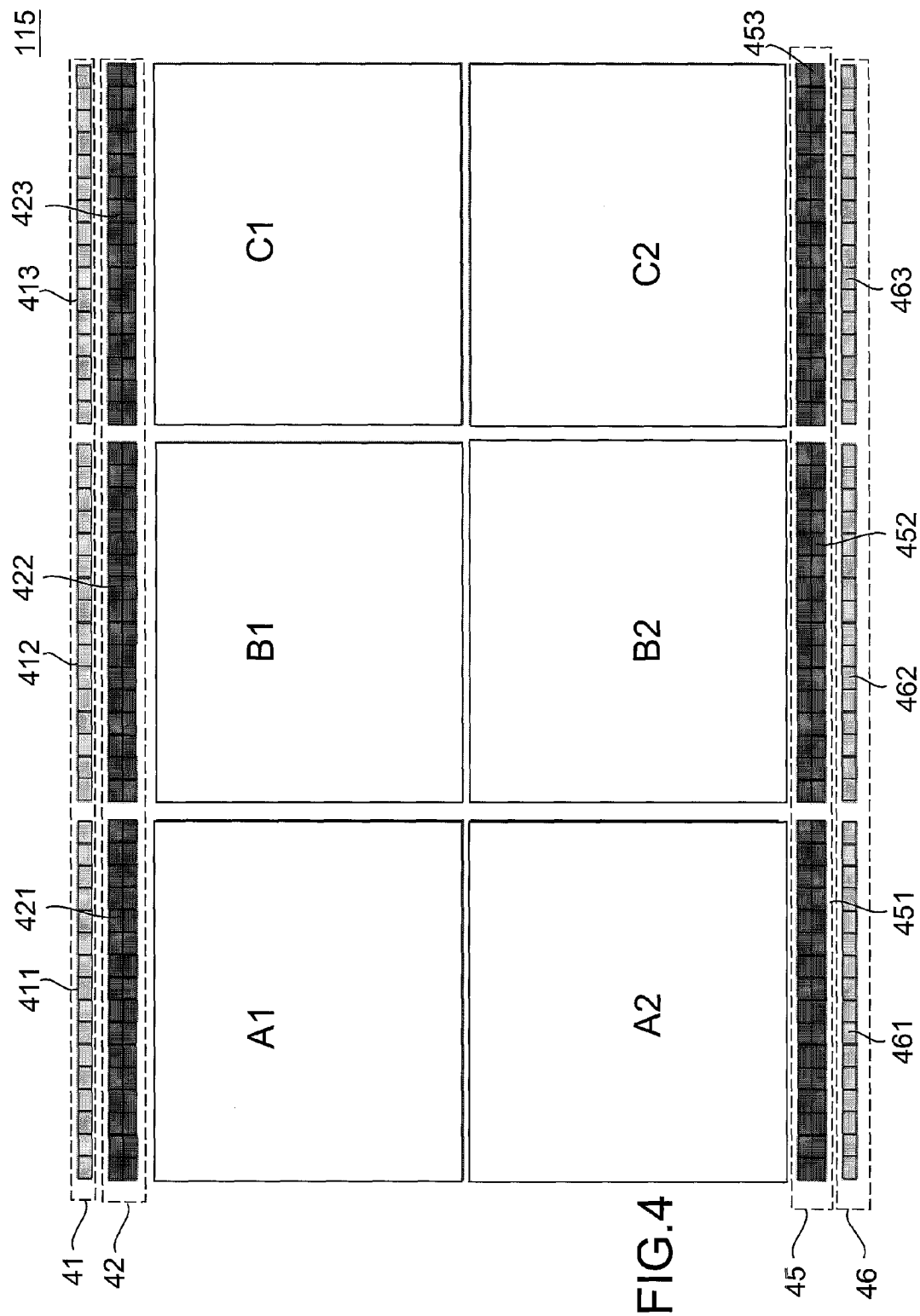
FIG. 4 is a functional block diagram of a storage module according to an exemplary embodiment of the disclosure.

In the disclosure, an access frequency of a memory (as shown in FIG. 4) is reduced through design of hardware architecture, so as to further reduce the power consumption. Moreover, through modifications of the architecture design, a bandwidth utilization of a decoding output register is improved, so as to reduce the utilization frequency of the decoding output register. In the disclosure, design of a standard TBCC digital decoder of current wireless communication system, for example, Worldwide Interoperability for Microwave Access (WiMAX) and Third Generation Partnership Project Long Term Evolution (3GPP LTE) can be modified, but the disclosure is not thus limited.

In the architecture of the TBCC digital decoder according to the disclosure, a decoding output of TBCC decoding process (or the output of the convolutional decoder) may be obtained through simple bit substitution on the previous state (or the current state), the current state (or the next state), and corresponding predicted decoded bits, so as to save a lot of power consumption for looking up in the look-up table and a memory area required by creation of the look-up table.

In addition, the disclosure provides a special method for predicting a maximum likelihood path with a small memory area, so as to reduce the power consumption of tracing process (which includes trace forward and trace back) or decoding. The TBCC digital decoder has a determination mechanism as architecture for pre-decoding output, and does not need any register. When the pre-decoding fails, the process returns to the trace forward decoding manner or the trace back memory decoding manner of the conventional art. Data access of the memory occupies approximately 80% of the power consumption, such that it is quite important to reduce the utilization of the memory and turn off power of the memory when the memory is not used, so as to reduce the power consumption.

In the disclosure, in the TBCC digital decoder, it is determined whether a decoding process of a pre-decoder has an error mainly through the existing (1) tail-biting property, (2) best state comparison circuit, (3) determination of the continuity of the branch metric. The determination mechanism executes the pre-decoding process when determining the best path solution, so as not to affect the system performance. In addition, the TBCC digital decoder uses a register as records of the pre-decoder and the continuity of the branch metric, and determines whether to continue to execute the pre-decoder according to the records. Moreover, the TBCC digital decoder may be applicable to the trace forward decoding manner or the trace back decoding manner.

The disclosure provides a special method for predicting a maximum likelihood path with a small area memory. In the method for predicting the maximum likelihood path, a circular property of the TBCC is utilized. Further, through a fixed correlation property between a pre-state and a current state of the convolutional code, it is determined whether the pre-decoding in the execution of the pre-decoder is successful. In addition, in the method for predicting the maximum likelihood path, through the fixed correlation property between the current state and a next state of the convolutional code, it is determined whether the pre-decoding in the execution of the pre-decoder is successful.

If the pre-decoding is successful, a correct original code may be obtained through a pre-decoded value of the register without accessing to the memory. Further, no matter whether the algorithm of finding an initial state of the TBCC in the trace forward convergence manner or the algorithm of finding the initial state of the TBCC in the trace back convergence manner is used, when the system performance is not affected, the simple pre-decoding mechanism may be added to save the time for decoding, thereby saving the hardware and improving the power performance. In another aspect, if the pre-decoding process is determined to be successful, it is not necessary to stop the pre-decoder, and it is not necessary to activate the trace back convergence mechanism or the trace forward convergence mechanism. Here, during the decoding process, it is only necessary to read the accessed (predicted) decoded bits from the register, so as to obtain the decoding output of the TBCC. In this manner, a lot of power consumption for tracing or decoding may be saved.

FIG. 1A is a block diagram of a TBCC decoder 11 according to an exemplary embodiment of the disclosure. The TBCC decoder 11 includes an add-compare-select (ACS for short) module 111, a path metric storage module 112, a compare-all-state comparator (comparator for short) 113, a pre-decoder 114, a survivor path and pre-decoded bits storage module 115 (abbreviated as storage module 115 hereinafter), a control module 116, and an output generator 117.

The add operation, compare action, and select action performed by the ACS module 111 are common technical approaches in the Viterbi decoder architecture. The TBCC decoder 11 is a Viterbi decoder in broad sense. Therefore, the one of ordinary skill in the art should easily understand various manners for implementing the ACS module 111. Therefore, in the disclosure, technical features and elements of the ACS module 111 are not mentioned in detail here.

The ACS module 111 is connected to an input interface 10, and receives received sequential data through the input interface 10. The received sequential data is generated by a transceiver module (not shown) located in front of the TBCC decoder 11 after down-converting the frequency of a received radio-frequency signal or demodulating the received radio-frequency signal to a baseband signal. The received sequential data is converted to a situation in which the received sequential data is just encoded in TBCC code, or is used as received coded bits. Therefore, the TBCC decoder 11 needs to decode the received sequential data as decoded sequential data. It is expected that the decoded sequential data may be correctly recovered to the state before a transmitting end originally performs the TBCC coding on the original data.

The ACS module 111 includes a plurality of ACS units, and each ACS unit receives 4 branch metrics and 4 path metrics in the received sequential data in each stage (or each convergence level). In other words, the ACS module 111 performs the ACS operation on the received sequential data, so as to obtain the branch metrics and 4 path metrics in each stage (or each convergence level). The stage is a decoding stage, and each decoding stage may generate data of 2 bits stored in the storage module 115. The generated data of 2 bits stored in the storage module 115 is a processing manner of a radix-4 architecture. However, the disclosure is not limited to the above, and the TBCC decoder may also be applicable to a radix-2, radix-8, or radix-16 processing architecture.

Further, when the TBCC decoder 11 just uses the existing decoding method of the trace back convergence method or the existing decoding method of the trace forward convergence method, the data of 2 bits generated in each decoding stage (or convergence level) may be stored in a random access memory (RAM) in the storage module 115. Relatively, when the TBCC decoder 11 just uses the pre-decoder 114 to execute the decoding action, the data of 2 bits generated in each decoding stage may be stored in a register of the storage module 115.

The branch metric is a Hamming distance between a received symbol and an expected symbol in the received sequential data. In the ACS module 111, each ACS unit adds a corresponding path metric to each branch metric, and the ACS unit compares the two generated results and selects the result having the smaller path metric. Usually, one ACS unit is assigned one state. Therefore, in the radix-4 architecture, the ACS module 111 has 64 ACS units. Usually, the ACS module 111 is a power consuming module.

The path metric storage module 112 is connected to the ACS module 111, receives the data from the ACS module 111 and also provides the data to the ACS module 111. The path metric storage module 112 stores data of the path metric of each state of the current stage, and delivers the data of the path metric to the ACS module 111 of a next stage.

The comparator 113 is connected to the path metric storage module 112, the path metric storage module 112 receives each state of the current stage (for example, each stage has 64 states), and the comparator 113 compares all the states, so as to determine a state (number) corresponding to a minimum path metric value, and provide the corresponding state (number) to the pre-decoder 114.

In the disclosure, it is assumed that in each stage the ACS module 111 has $2^k$ states, the ACS module 111 needs to execute the ACS action for $2^k$ times, and $2^k$ path metrics corresponding to each state are updated once in each state. In addition, the comparator 113 obtains one state from the $2^k$ path metrics, and selects one group of bytes as input values of the pre-decoding process from outputs of the $2^k$ units of the ACS module 111.

The pre-decoder 114 is connected to the ACS module 111, the comparator 113, the storage module 115, and the control module 116. The pre-decoder 114 receives the state corresponding to the minimum path metric value of the current stage from the comparator 113, and compares whether the state corresponding to the minimum path metric of the current stage and the state corresponding to the minimum path metric of the previous stage are in continuity. Alternatively, the pre-decoder 114 can compare whether the state corresponding to the minimum path metric of the current stage and the state corresponding to the minimum path metric of the next stage are in continuity. If the state corresponding to the minimum path metric of the current stage and the state corresponding to the minimum path metric of the neighboring stage are in continuity, the pre-decoder 114 outputs the predicted decoded bits to the storage module 115.

If the state corresponding to the minimum path metric of the current stage and the state corresponding to the minimum path metric of the neighboring stage are not in the continuity, the pre-decoder 114 delivers a notification signal to the control module 116, and stops the current pre-decoding process until the control module 116 provides another control signal to wake up the pre-decoder 114 to continue for performing the pre-decoding process. In addition, in the disclosure, the current state is defined as the state (number) corresponding to the minimum path metric of the current stage.

When the pre-decoding process is stopped, through the conventional decoding method of the track back convergence method or through the conventional decoding method of the track forward convergence method, the control module 116 achieves the TBCC decoding process.

In addition, if the decoded bits in the pre-decoding process (or the pre-decoder 114) are correct after a pre-defined period of time, for example, a truncation length, it represents that the pre-decoding during the pre-defined period of time is successful. Therefore, for example, predicted decoded bits previously stored in a column of registers 411 in FIG. 4 may be directly output.

The highest 1, 2, and 3 bits (respectively corresponding to the radix-2 architecture, the radix-4 architecture, and the radix-8 architecture) of the pre-state (or the current state) in the pre-decoder 114 are set as possible path values. The bits are k bits of Most Significant Bits (MSBs), that is, the configured possible path values. In addition, the lowest 1, 2, and 3 bits (respectively corresponding to the radix-2 architecture, the radix-4 architecture, and the radix-8 architecture) of the current state (or the next state) in the pre-decoder 114 are maximum likelihood decoded values (or the predicted decoded bits) through the pre-decoding process. The pre-decoder 114 determines whether the possible path values of the neighboring stages are in continuity based on the state corresponding to the minimum path metric provided by the ACS module 111 (compare all states).

The storage module 115 is connected to the ACS module 111, the pre-decoder 114, and the control module 116. The storage module 115 at least includes three rows of registers or memories. The first row is the register (for example, the register module 41 as shown in FIG. 4), which is configured for storing the data of the survivor path of each state output by the ACS module 111 to the storage module 115. The second row is the register (for example, the register module 42 as shown in FIG. 4), which is configured for storing the expected decoded bits provided by the pre-decoder 114 to the storage module 115. When the state corresponding to the minimum path metric of the current stage and the state corresponding to the minimum path metric of the neighboring stage are in continuity, the storage module 115 directly outputs the expected decoded bits to the control module 116.

The third row of memories (for example, the memory modules A1, A2, B1, B2, C1, and C2 as shown in FIG. 4) execute the conventional decoding method of the trace back convergence method, or merely use the conventional decoding method of the trace forward convergence method. In addition, the length of each row of registers or memory units is determined by the truncation length of the TBCC.

The control module 116 is connected to the pre-decoder 114, the storage module 115, and the output generator 117. The control module 116 controls the decoding action of the entire TBCC decoder 11. If the states corresponding to the minimum path metrics of the neighboring stages are in continuity before reaching the most tail end of the truncation length of the TBCC, the control module 116 directly reads the (predicted) decoded bits previously stored in the register from the storage module 115. The (predicted) decoded bits are output by the pre-decoder 114 in advance, and are stored in the storage module 115.

On the contrary, if the states corresponding to the minimum path metrics of the neighboring stages are not in continuity, through the survivor path (corresponding to the third row of memories), the control module 116 directly determines to start to use the conventional method of the track back convergence method or use the conventional decoding method of the track forward convergence method. Both the track back convergence decoding method and the track back convergence decoding method require the large capacity memory.

The output generator 117 is connected to the control module 116 and an output interface 12. The output generator 117 includes a plurality of registers to store the decoded bits, and the control module 116 receives the expected (predicted) decoded bits to generate the decoded sequential data. For the data received by the output generator 117, the last received data is decoded first, such that the output generator 117 reorders the expected decoded bits, so as to generate the decoded sequential data. In addition, in FIG. 1A, the comparator 113, the pre-decoder 114, the storage module 115, and the control module 116 may receive other external control signals of the TBCC decoder 11.

A state and path selection module 150 as shown in FIG. 1A includes an ACS module 111, a path metric storage module 112, and a comparator 113. In other words, the state and path selection module 150 is a control selection module formed by the ACS module 111, the path metric storage module 112, and the comparator 113. According to the aforementioned technical content, the state and path selection module 150 receives the sequential data encoded in TBCC, so as to select and provide a current state, a neighboring state, and a current path status corresponding to the sequence data to the pre-decoder 114 according to the sequence data. In addition, the state and path selection module 150 further selects and stores the data of the survivor path of each state in the storage module 115 according to the sequential data.

In an embodiment, the state and path selection module 150 selects and provides the current state, the pre-state, and the current path status corresponding to the sequential data to the pre-decoder 114 according to the sequential data. In the present embodiment, the 1, 2, and 3 bits (respectively corresponding to the radix-2 architecture, the radix-4 architecture, and the radix-8 architecture) of the MSBs of the pre-state are the set possible path values. In other words, k bits of the MSBs of the pre-state are the configured possible path values, and the value of k corresponds to a butterfly operation unit using $2^k$ base number as a basis, in which the $2^k$ base number is, for example, the radix-2 architecture, the radix-4 architecture, or the radix-8 architecture. In addition, the lowest 1, 2, and 3 bits (respectively corresponding to the radix-2 architecture, the radix-4 architecture, and the radix-8 architecture) of the current state are the predicted maximum likelihood decoded values (or the predicted decoded bits). In other words, the highest k bits of the current state are the predicted decoded bits. From another perspective, when the current state, the pre-state, and the current path status corresponding to the sequential data are obtained through the radix-$2^k$ butterfly operation unit architecture, the highest k bits of the pre-state are the possible path values, and the lowest k bits of the current state are the predicted decoded bits.

In another embodiment, the state and path selection module 150 selects and provides the current state, the next state, and the current path status corresponding to the sequential data to the pre-decoder 114 according to the sequential data. As described previously, in this embodiment, the 1 bit, the 2 bit, and the 3 bits (respectively corresponding to the radix-2 architecture, the radix-4 architecture, and the radix-8 architecture) of the MSBs of the current state are the configured possible path value. In other words, the k bits of the MSBs of the current state are the configured possible path values, and the value of k corresponds to the butterfly operation unit using $2^k$ base number as a basis, in which the $2^k$ base number is, for example, the radix-2 architecture, the radix-4 architecture, or the radix-8 architecture. In addition, the lowest 1, 2, and 3 bits (respectively corresponding to the radix-2 architecture, the radix-4 architecture, and the radix-8 architecture) of the next state are the maximum likelihood decoded values which should be obtained previously (or the predicted decoded bits). In other words, the highest k bits of the current state are the predicted decoded bits. From another perspective, when the current state, the next state, and the current path status corresponding to the sequential data are obtained through the radix-$2^k$ butterfly operation unit architecture, the highest k bits of the current state are the possible path values, and the lowest k bits of the next state are the predicted decoded bits.

In still another embodiment, the state and path selection module 150 selects the pre-state, the current state, the next state, and the current path status, from the sequential data, corresponding to the sequential data and provides the pre-state, the current state, the next state, and the current path status corresponding to the sequential data to the pre-decoder 114.

Figure 1B:
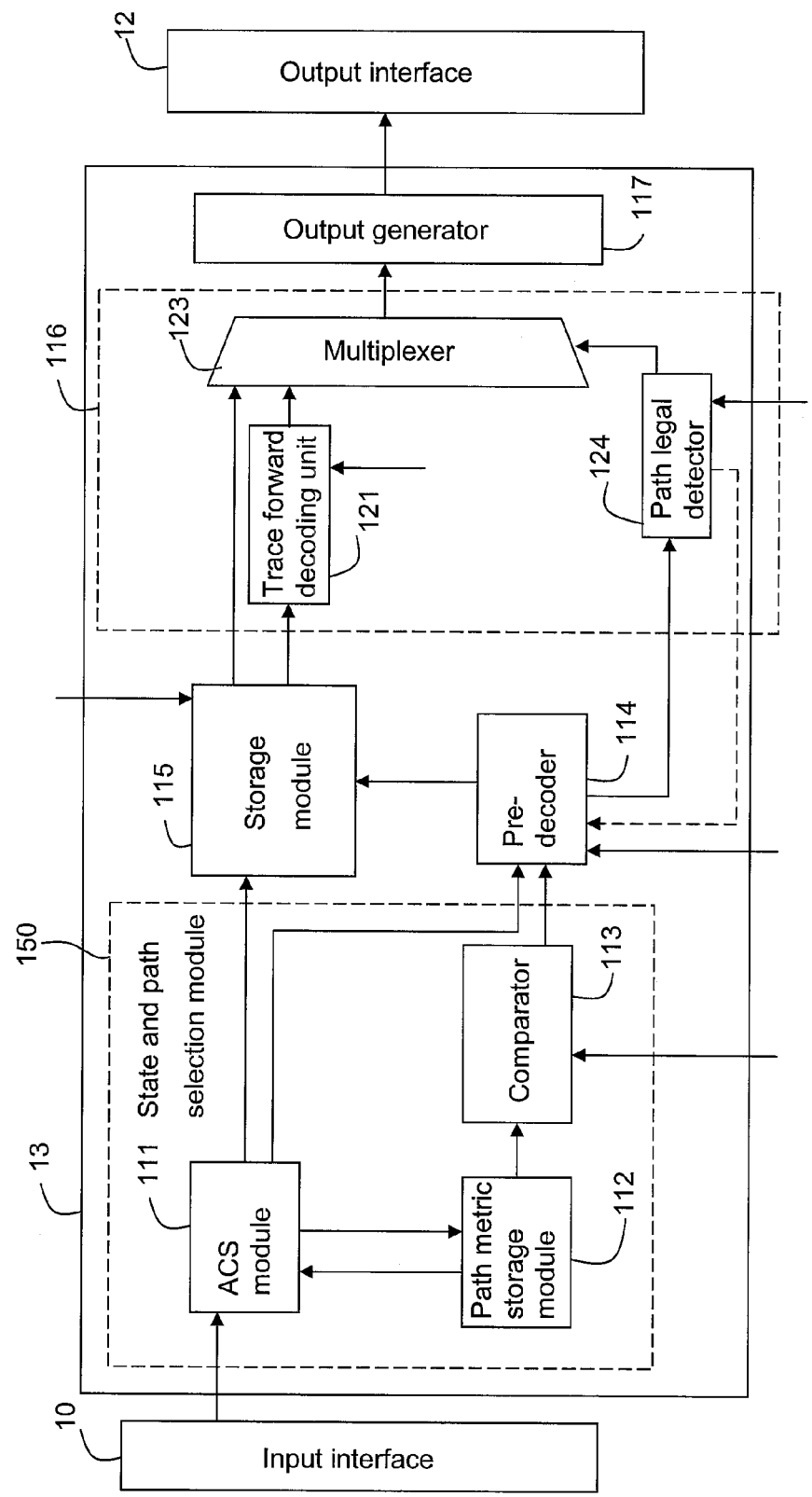
FIG. 1B is a block diagram of another TBCC decoder according to another exemplary embodiment of the disclosure.

FIG. 1B is a block diagram of another TBCC decoder 13 according to another exemplary embodiment of the disclosure. The TBCC decoder 13 is similar to the TBCC decoder 11. However, the control module 116 of the TBCC decoder 13 further includes a trace forward decoding unit 121, a path legal detector unit 124, and a multiplexer 123.

Further, the trace forward decoding unit 121 is connected between the storage module 115 and the multiplexer 123, for executing the trace forward convergence decoding method. The path legal detector unit 124 is connected to the pre-decoder 114 and the multiplexer 123. In addition, the storage module 115 further has a path directly connected to the multiplexer 123.

The path legal detector unit 124 determines whether states corresponding to minimum path metrics of neighboring stages pre-decoded by the pre-decoder 114 are in continuity. If the states corresponding to the minimum path metrics of the pre-decoded neighboring stages are in continuity, the multiplexer 123 is controlled by the path legal detector unit 124 to directly read expected (or predicted) decoded bits (or pre-decoded bits) stored previously in the register from the storage module 115, and outputs the (predicted) decoded bits to the output generator 117.

If the path legal detector unit 124 determines that the states corresponding to the minimum path metrics of the neighboring stages pre-decoded by the pre-decoder 114 are not in continuity, the path legal detector unit 124 sends a control signal to the multiplexer 123, so as to selectively control the trace forward decoding unit 121 to perform the decoding process. The path legal detector unit 124 controls the multiplexer 123 to directly output the decoded bits to the output generator 117 from the trace forward decoding unit 121. In addition, the trace forward decoding unit 121 executes the trace forward convergence decoding method.

Figure 1C:
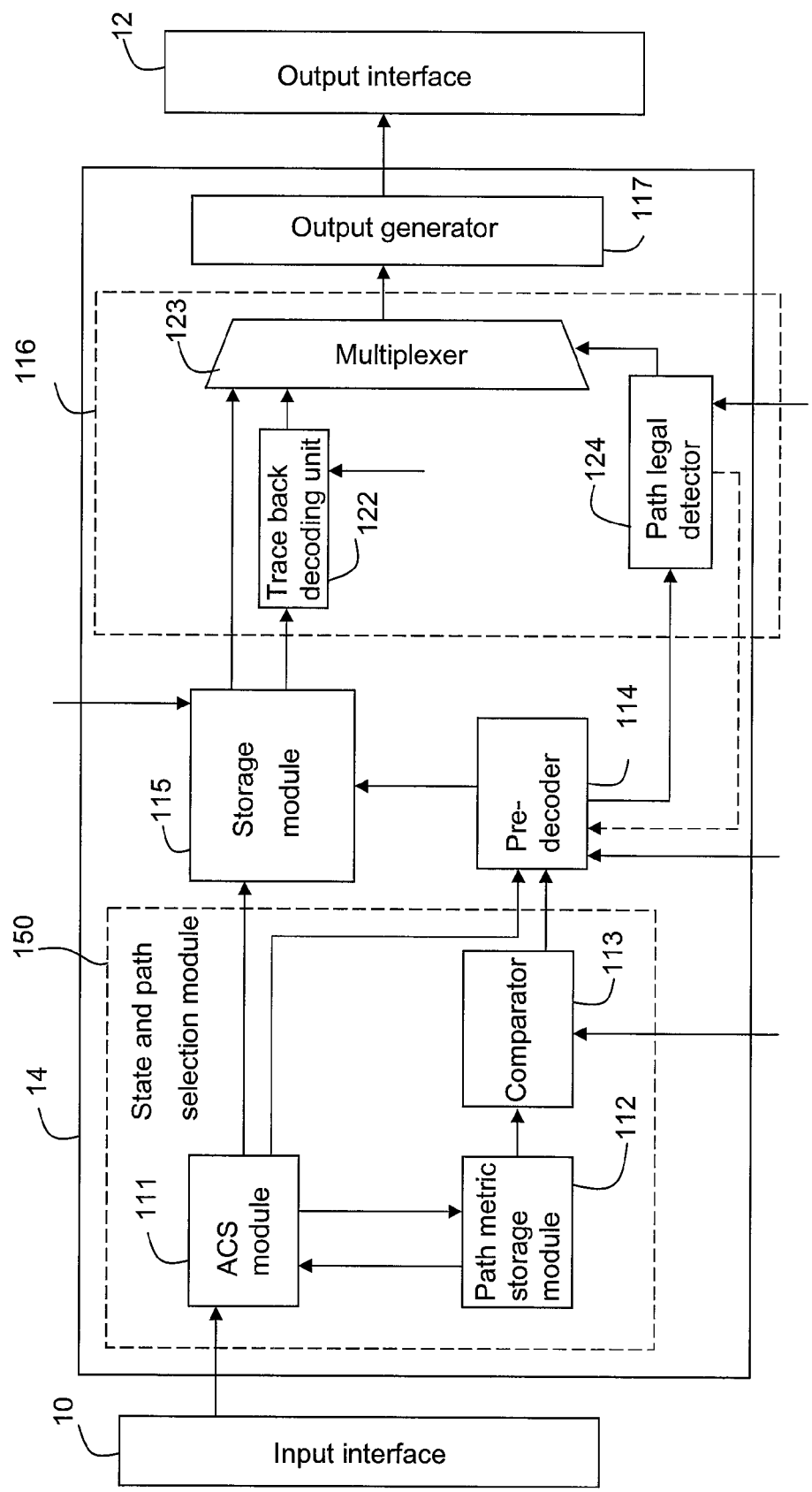
FIG. 1C is a block diagram of another TBCC decoder according to another exemplary embodiment of the disclosure.

FIG. 1C is a block diagram of another TBCC decoder 14 according to another exemplary embodiment of the disclosure. The TBCC decoder 14 is similar to the TBCC decoder 13, but the trace forward decoding unit 121 is replaced by a trace back decoding unit 122.

If the path legal detector unit 124 determines that the states corresponding to the minimum path metrics of the neighboring stages pre-decoded by the pre-decoder 114 are not in continuity, the path legal detector unit 124 sends a control signal to the multiplexer 123, so as to selectively control the trace back decoding unit 122 to perform the decoding process. In addition, the path legal detector unit 124 controls the multiplexer 123 to directly output the decoded bits to the output generator 117 from the trace back decoding unit 122. The trace back decoding unit 122 executes the trace back convergence decoding method.

It should be noted that in the exemplary embodiments of FIG. 1A to FIG. 1C, the data relevant to the track back convergence of the previous stage is not cleared but is reserved. When the path of the trace back convergence of the current stage and the path of the previous stage are merged or converged, the required data may be repeatedly used, so as to reduce the frequency of accessing to the memory and the consequent power consumption. In addition, when the states (numbers) corresponding to the minimum path metric value of each neighboring stage are in continuity, the possible decoded bits may be recorded as the predicted decoded bits. When the states (numbers) corresponding to the minimum path metric value of each neighboring stage are not in continuity, the pre-decoding process is stopped.

The state and path selection module 150 in FIG. 1B and FIG. 1C is similar to the state and path selection module 150 as shown in FIG. 1A, so the technical feature of the state and path selection module 150 is not described again here.

Figure 2A:
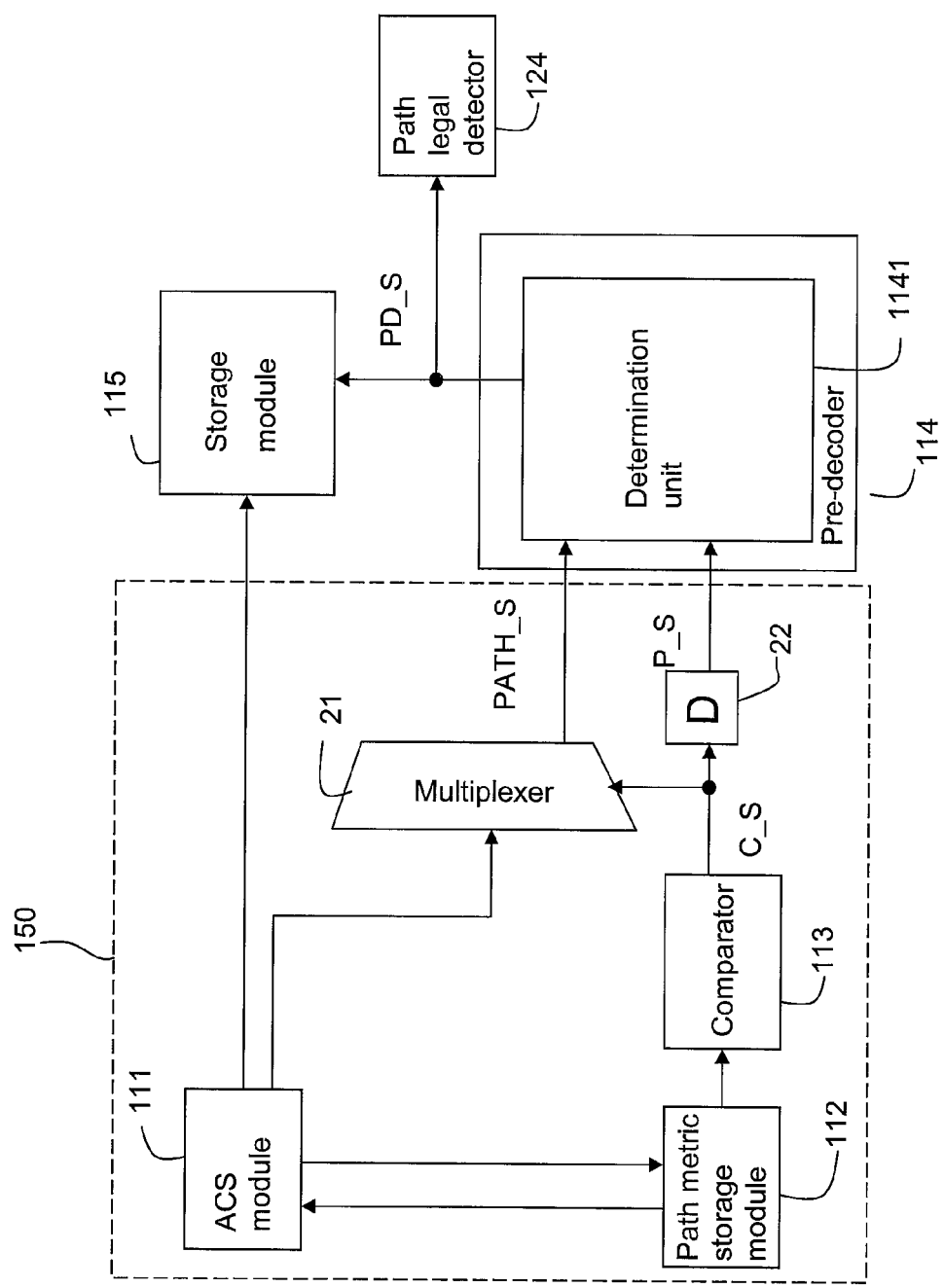
FIG. 2A to FIG. 2C are schematic views of detailed connection relations among an add-compare-select (ACS) module, a path metric storage module, a comparator, a pre-decoder, and a storage module according to several exemplary embodiments.

FIG. 2A is a schematic view of detailed connection relations among the ACS module 111, the path metric storage module 112, the comparator 113, the pre-decoder 114, and the storage module 115 according to an exemplary embodiment. In addition to the connection relations among the ACS module 111, the path metric storage module 112, the comparator 113, and the storage module 115 illustrated in FIG. 1A, FIG. 2A further describes how the pre-decoder 114 obtains the current path, the current state, and the pre-state from the ACS module 111 and the comparator 113.

As shown in FIG. 2A, the pre-decoder 114 includes a determination unit 1141. The determination unit 1141 is connected to the comparator 113 through a delay unit 22, is connected to the ACS module 111 through a multiplexer 21, and is connected to the storage module 115. In addition to providing the current state C_S to the determination unit 1141, the comparator 113 provides the current state C_S to the multiplexer 21. The multiplexer 21 selects a corresponding state (number) having the minimum path metric value from a plurality of paths (for example, $2^k=2^6=64$ possible paths) according to the current state C_S, and provides the corresponding state (current path state) PATH_S to the determining unit 1141. In addition, the multiplexer 21 also provides the current state C_S to the determination unit 1141.

The delay unit 22 delays the received current state C_S for a waiting time. The waiting time is, for example, an interval time between the current state C_S and the pre-state P_S, or is equal to an operation time required by each stage (each convergence stage). The determining unit 1141 determines whether the pre-decoding process of the pre-decoder 114 is correct according to the pre-state P_S, the current state C_S delayed for the waiting time, and the current path status PATH_S. As described in the exemplary embodiment of FIG. 1A, it is determined whether the state corresponding to the minimum path metric of the current stage and the state corresponding to the minimum path metric of the neighboring stage (a previous stage or a next stage) are in continuity.

No matter the pre-decoding process is correct or not, the pre-decoder 114 generates the decoded bits PD_S to the storage module 115 and the path legal detector unit 124. In addition, the determination unit 1141 provides a determination result (that is, success or failure, or a determination signal LP_RS as shown in FIG. 3A) to the path legal detector unit 124.

Only when the pre-decoding process in a windowing period is correct, the path legal detector unit 124 controls the multiplexer 123 to directly output the stored decoded bits PD_S to the output generator 117 from the register of the storage module 115. Therefore, the path legal detector unit 124 further includes a counter for accumulating a current stage amount or a convergence level amount. If the pre-decoding process error occurs in the windowing period, the path legal detector unit 124 stops the pre-decoder 114, and changes to use the trace back convergence decoding method or the trace forward convergence decoding method in the conventional art. The windowing period is, for example, 32 stages (or convergence levels). The storage module 115 continuously stores the decoded bits PD_S of each stage (or each convergence level) through the register.

Figure 2B:
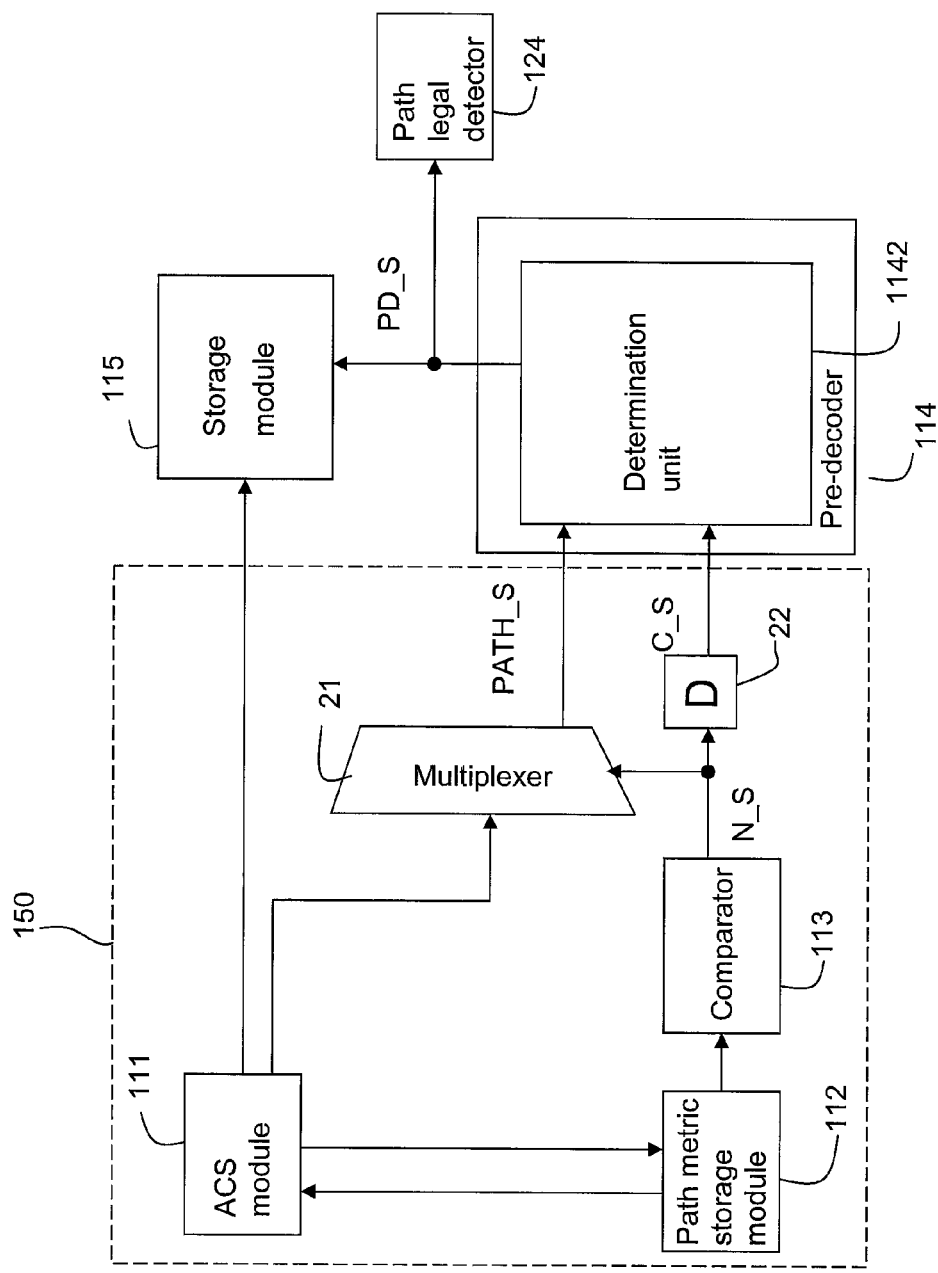

FIG. 2B is a schematic view of detailed connection relations among the ACS module 111, the path metric storage module 112, the comparator 113, the pre-decoder 114, and the storage module 115 according to another exemplary embodiment. In FIG. 2B, the pre-decoder 114 includes a determination unit 1142. The determination unit 1142 is similar to the determination unit 1141 in FIG. 2A, but the received input data is the next state N_S provided by the comparator 113, the current state C_S delayed by the delay unit 22, and the current path status PATH_S provided by the multiplexer 21. The determination unit 1142 further determines whether the pre-decoding process of the pre-decoder 114 is correct according to the received current state C_S, next state N_S, and current path status PATH_S.

The state and path selection module 150 as shown in FIG. 2A and FIG. 2B includes a multiplexer 21, a delay unit 22, an ACS module 111, a path metric storage module 112, and a comparator 113. In other words, the state and path selection module 150 is a control selection module formed by the multiplexer 21, the delay unit 22, the ACS module 111, the path metric storage module 112, and the comparator 113. The state and path selection module 150 receives the sequential data encoded in TBCC, so as to select the current state, the neighboring state, and the current path status (corresponding to the sequential data) from the sequential data, and provide the current state, the neighboring state, and the current path status to the pre-decoder 114. In addition, the state and path selection module 150 further selects and stores the data of the survivor path of each state in the storage module 115 according to the sequential data.

Figure 2C:
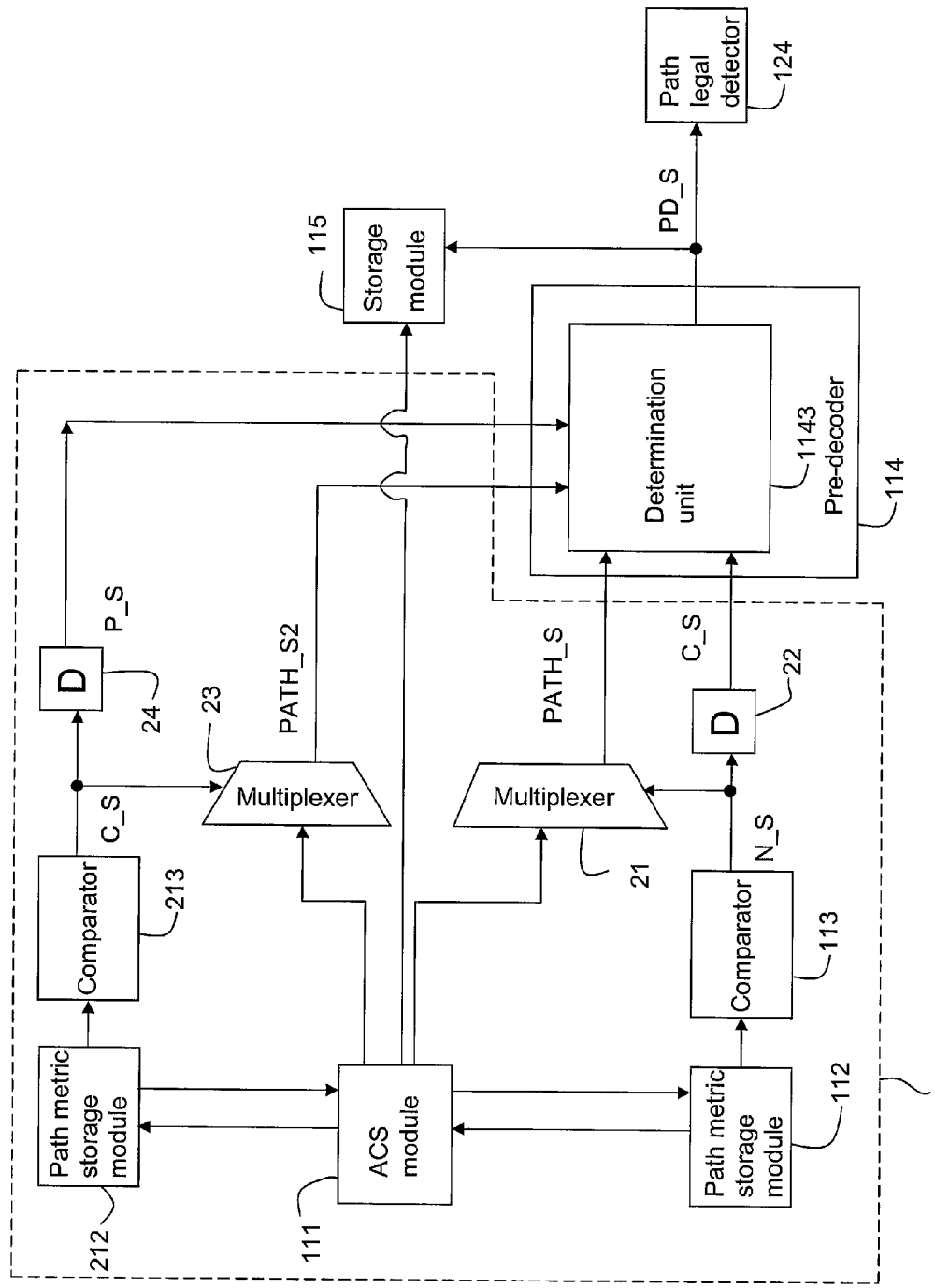

FIG. 2C is a schematic view of detailed connection relations among the ACS module 111, the path metric storage module 112, the comparator 113, the pre-decoder 114, and the storage module 115 according to another exemplary embodiment. In FIG. 2C, in addition to the original connection relations in FIG. 2A, the determination unit 1143 of the pre-decoder 114 is further connected to the multiplexer 23 and the delay unit 24, and is indirectly connected to the comparator 213 and the path metric storage module 212 through the delay unit 24. The ACS module 111 is connected to both the multiplexer 23 and the path metric storage module 212.

In the implementation of FIG. 2C, there are mainly two paths which respectively provide data such as {current state C_S; next state N_S; current path status PATH_S} and {current state C_S; pre-state P_S; current path status PATH_S2} to the determination unit 1143. The determination unit 1143 further determines whether the pre-decoding process of the pre-decoder 114 is correct according to the data provided from the two paths. The operation mechanisms among the ACS module 111, the path metric storage module 212, the comparator 213, the multiplexer 23, the delay unit 24, the determination unit 1143, and the storage module 115 are respectively similar to interaction mechanisms among the corresponding elements in FIG. 2A, and may be known with reference to FIG. 2A, so the technical features thereof are not described in detail here.

The state and path selection module 150 as shown in FIG. 2C includes an ACS module 111, a path metric storage module 112, a comparator 113, a multiplexer 21, a delay unit 22, a multiplexer 23, a delay unit 24, a path metric storage module 212, and a comparator 213. In other words, the state and path selection module 150 is a control selection module formed by the ACS module 111, the path metric storage module 112, the comparator 113, the multiplexer 21, the delay unit 22, the multiplexer 23, the delay unit 24, the path metric storage module 212, and the comparator 213. The state and path selection module 150 receives the sequential data encoded in TBCC, so as to select, from sequential data, the current state, the neighboring state, and the current path status corresponding to the sequential data and provide the current state, the neighboring state, and the current path status to the pre-decoder 114. In addition, the state and path selection module 150 further selects and stores the data of the survivor path of each state in the storage module 115 according to the sequential data.

FIG. 3A is a functional block diagram of the comparator 1141 according to an exemplary embodiment. Referring to FIG. 2A and FIG. 3A, input ends A and B of the determining unit 1141 respectively receive two types of input data: {current state C_S; current path status PATH_S} and pre-state P_S. The determination unit 1141 determines whether the pre-decoding process of the pre-decoder 114 is correct according to the two types of input data.

If the state corresponding to the minimum path metric of the current state C_S and the state corresponding to the minimum path metric of the pre-state P_S are in continuity, an output end C of the determination unit 1141 outputs a determination signal LP_RS to the path legal detector unit 124, so as to notify the path legal detector unit 124 that the current pre-decoding process is correct. Meanwhile, the pre-decoder 114 outputs the pre-decoded bits PD_S to the storage module 115. If the sate corresponding to the minimum path metric of the current state C_S and the state corresponding to the minimum path metric of the pre-state P_S are not in continuity, the output end C of the determining unit 114 outputs a determination signal LP_RS to the path legal detector unit 124, so as to notify the path legal detector unit 124 that the current pre-decoding process has an error.

FIG. 3B is a functional block diagram of another comparator 1142 according to another exemplary embodiment. The comparator 1142 is similar to the comparator 1141, but input ends A and B respectively receive two types of input data: {next state N_S; current path status PATH_S} and the current state C_S, and determines whether the pre-decoding process of the pre-decoder 114 is correct according to the two types of input data.

If the state corresponding to the minimum path metric of the current state C_S and the state corresponding to the minimum path metric of the next state N_S are in continuity, an output end C of the determining unit 1142 outputs a determination signal LP_RS to the path legal detector unit 124, so as to notify the path legal detector unit 124 that the current pre-decoding process is correct. Meanwhile, the pre-decoder 114 outputs the pre-decoded bits PD_S to the storage module 115. If the sate corresponding to the minimum path metric of the current state C_S and the state corresponding to the minimum path metric of the pre-state P_S are not in continuity, the output end C of the determining unit 114 outputs a determining signal LP_RS to the path legal detector unit 124, so as to notify the path legal detector unit 124 that the current pre-decoding process has an error.

Figure 3C:
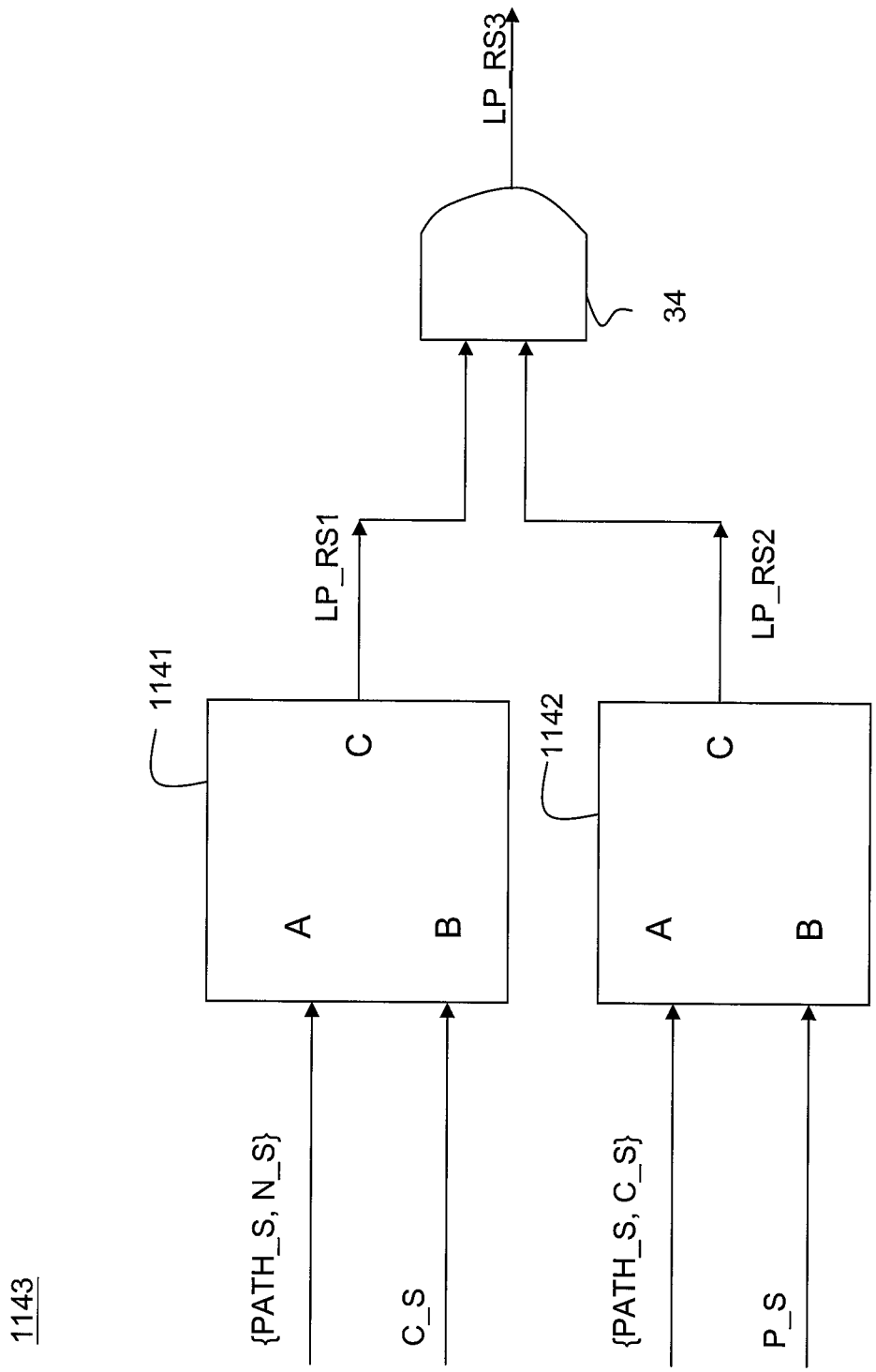
FIG. 3C is a functional block diagram of another comparator according to another exemplary embodiment.

FIG. 3C is a functional block diagram of another comparator 1143 according to another exemplary embodiment. Referring to FIG. 3C, the comparator 1143 includes the comparator 1141 and the comparator 1142, and respectively receives 4 types of input data: {next state N_S; current path status PATH_S} and current state C_S; and {current state C_S; current path status PATH_S} and pre-state P_S. The comparator 1143 performs operations on two determination signals LP_RS1 and LP_RS2 generated by the comparator 1141 and the comparator 1142 through determination by using an AND gate 34, so as to output a third determination signal LP_RS3 to the path legal detector unit 124, thereby notifying the path legal detector unit 124 whether the current pre-decoding process is correct.

After the detailed connection relations among the ACS module 111, the path metric storage module 112, the comparator 113, the pre-decoder 114, and the storage module 115 are introduced, the approach of how to determine whether the next state N_S and the current state C_S are in continuity or whether the current state C_S and the pre-state P_S are in continuity are introduced below in accordance with FIG. 3D, FIG. 3E, and FIG. 3F.

Figure 3D:
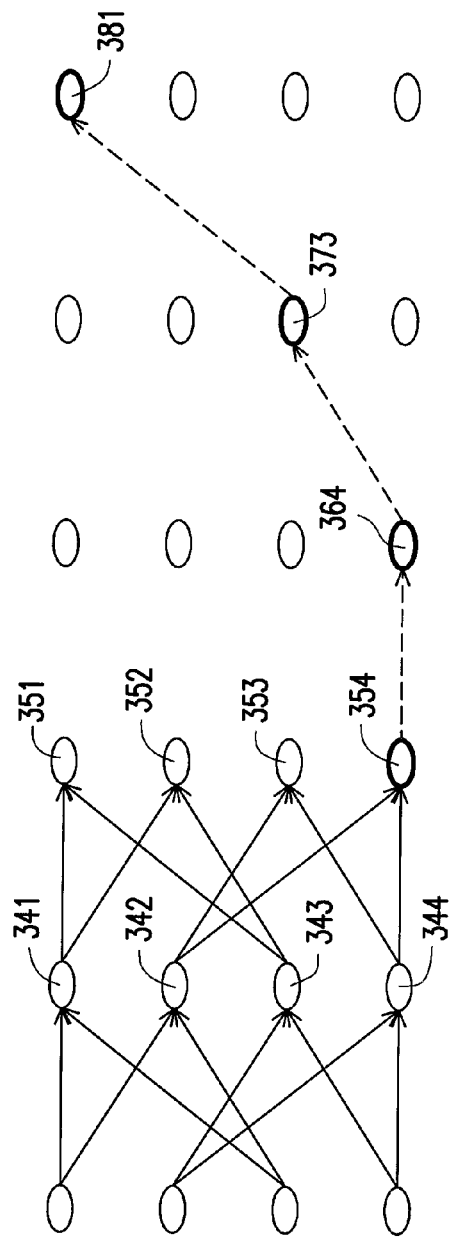
FIG. 3D shows a decoding path in which radix-2 neighboring states are in continuity.

FIG. 3D shows a decoding path in which radix-2 neighboring states are in continuity. Referring to 3D, nodes 341, 342, 343, and 344 are respectively possible states of the same stage (or convergence level): a first possible state (for example, 00), a second possible state (for example, 01), a third possible state (for example, 11), and a fourth possible state (for example, 10). The node 341 may be connected to the nodes 351 and 352, which represents the situation when the current state is the node 341, and the next state may be the nodes 351 and 352. The node 342 may be connected to the nodes 353 and 354, which represents the situation when the current state is the node 342, and the next state may be the nodes 353 and 354. The node 343 may be connected to the nodes 351 and 352, which represents the situation when the current state is the node 343, and the next state may be the nodes 351 and 352. The node 344 may be connected to the nodes 353 and 354, which represents the situation when the current state is the node 344, and the next state may be the nodes 353 and 354.

As shown in FIG. 3D, the node 354 is connected to the node 364, and is connected to the nodes 373 and 381 to form one legal path. In other words, the node 344 is connected to the node 354, the node 364, the node 373, and finally the node 381, so as to form the neighboring states which are in continuity. Further, when the node 344 may be connected to node 354, and the node 354 may be connected to the third possible state and the fourth possible state, the node 354 may be connected to the node 364. As described previously, the node 364 may be connected to the third possible state and the fourth possible state, such that the node 364 may be connected to the node 373. Finally, the node 373 may be connected to the first possible state and the second possible state, such that the node 373 may be connected to the node 381.

Figure 3E:
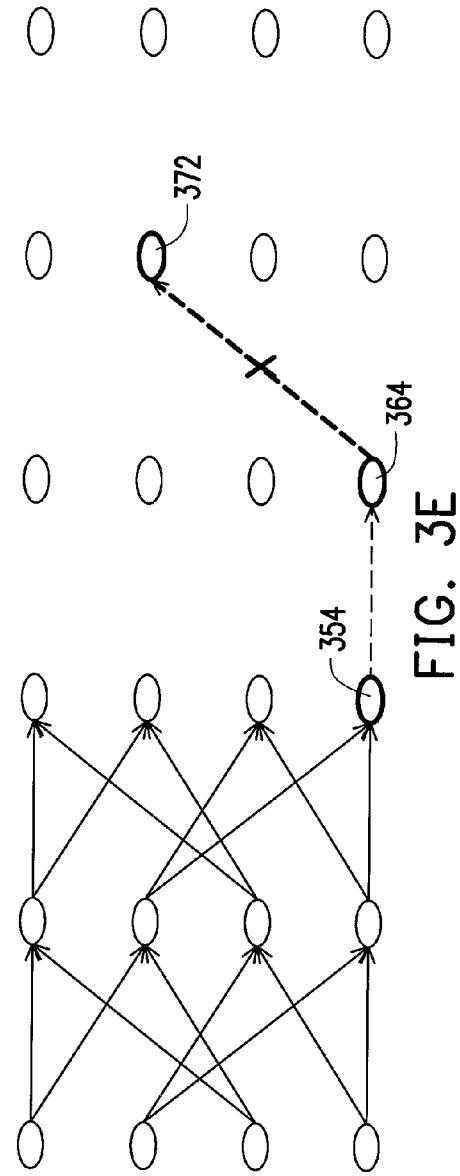
FIG. 3E shows a decoding path in which radix-2 neighboring states are not in continuity.

FIG. 3E shows a decoding path in which radix-2 neighboring states are not in continuity. Referring to FIG. 3E, as compared with FIG. 3D, when the node 364 needs to connect to the node 372, the node 364 can only be connected to the third possible state and the fourth possible state, such that when the node 364 is connected to the node 372, the neighboring states are not in continuity.

Figure 3F:
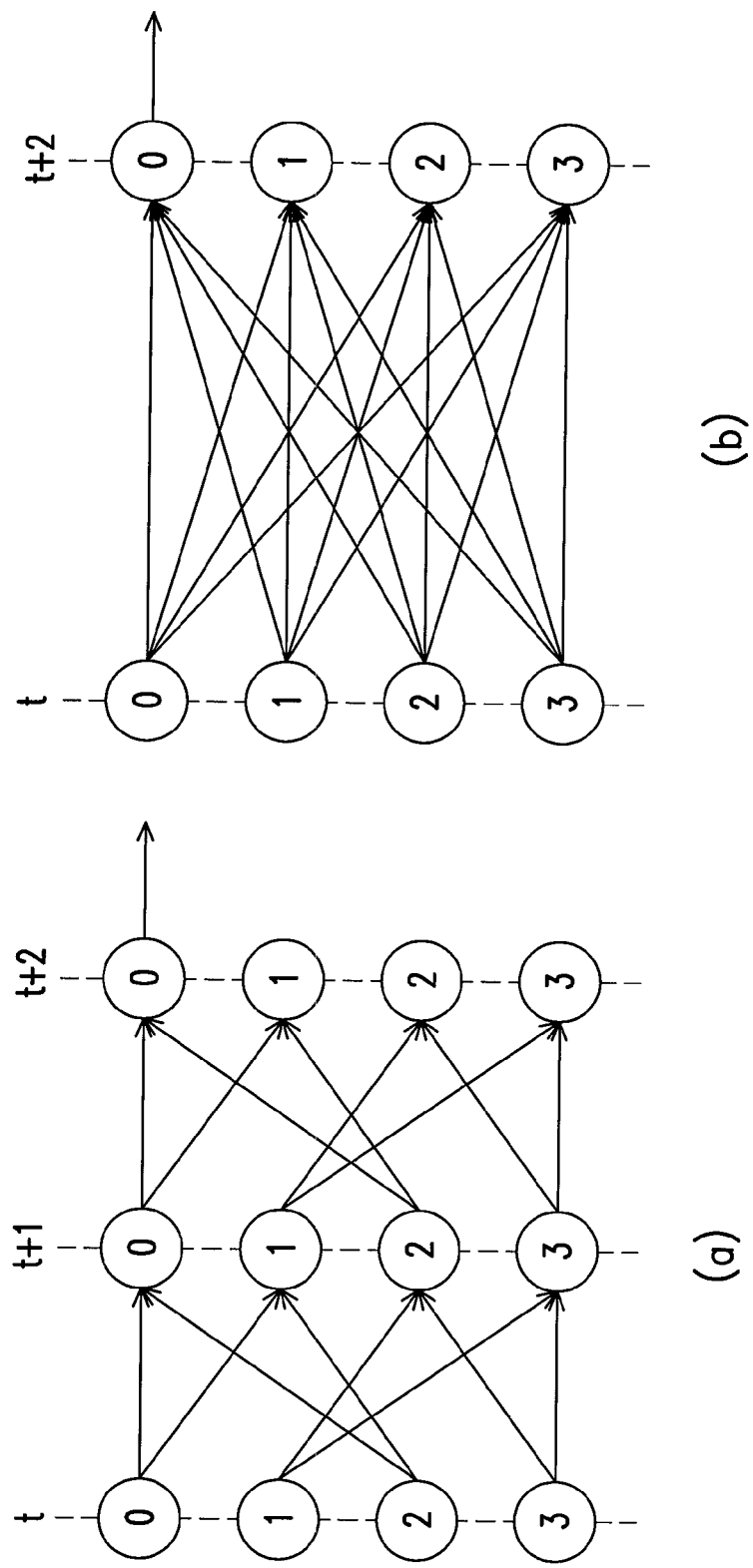
FIG. 3F shows possible decoding paths of radix-4 neighboring states.

FIG. 3F shows possible decoding paths with radix-4 neighboring states. Referring to FIG. 3F, a sub-diagram (a) of FIG. 3F shows possible stages capable of being connected in different stages (convergence levels) t, t+1, and t+2. A sub-diagram (b) of FIG. 3F further concludes that between different stages (convergence levels) t and t+2, that is, under a state of being at an interval of one stage (convergence level), each node in the stage (convergence level) t may be connected to any node in the stage (convergence level) t+2. Here, in the radix-4 decoding process, the sub-diagram (b) may be considered as a butterfly decoding unit, and the radix-4 decoding architecture may include 64 butterfly decoding units.

If the connection across the butterfly decoding units occurs between the current stage (or convergence level) and the next stage, it is determined that the state corresponding to the minimum path metric of the current state C_S and the state corresponding to the minimum path metric of the next state N_S are not in continuity. Similarly, if the connection across the butterfly decoding units occurs between the current stage (or convergence level) and the previous stage, it is determined that the state corresponding to the minimum path metric of the current state C_S and the state corresponding to the minimum path metric of the pre-state P_S are not in continuity. Other situations in which the connection across the butterfly decoding units does not occur are considered as the legal connection or the normal connection, that is, the states corresponding to the minimum path metrics of the neighboring states are in continuity.

FIG. 4 is a functional block diagram of the storage module 115 according to an exemplary embodiment of the disclosure. The storage module 115 in FIG. 4 is merely used as the exemplary embodiment for description without limiting the possible implementation of the disclosure. Referring to FIG. 4, the storage module 115 includes register modules 41, 42, 45, and 46, and memory modules A1, A2, B1, B2, C1, and C2. As described previously, a first row in FIG. 4 is the register module 41, which includes registers 411, 412, and 413, respectively configured for storing the data of the survivor path of each state output by the ACS module 111 to the storage module 115. A second row in FIG. 4 is the register module 42, which includes registers 421, 422, and 423, respectively configured for storing the expected decoded bits provided by the pre-decoder 114 to the storage module 115. When the states corresponding to the minimum path metrics of the neighboring stages are in continuity, the storage module 115 directly outputs the expected (or predicted) decoded bits to the control module 116.

A third row of memories in FIG. 4 include memory modules A1, A2, B1, B2, C1, and C2), configured for respectively executing the conventional decoding method of the trace back convergence method or the conventional decoding method of the trace forward convergence method. In addition, the length of each row of registers or memory units is determined by the truncation length of the TBCC. In this embodiment, the truncation length of the TBCC may be selected as a total length of two neighboring memory modules (for example, A1 and B1). The TBCC has a circular property, such that in the present embodiment, the memory modules A1 and B1 may perform the decoding process together, the memory modules B1, C1 may perform the decoding process together, and the memory modules C1, A1 may perform the decoding process together. That is to say, when the tail end of the truncation length of the decoding process performed by the memory modules A1 and B1 together is reached, the memory modules B1 and C1 perform the decoding process together without clearing the memory module A1; when the tail end of the truncation length of the decoding process performed by the memory modules B1 and C1 together is reached, the memory modules C1 and A1 perform the decoding process together without clearing the memory module B1; and when the tail end of the truncation length of the decoding process performed by the memory modules C1 and A1 together is reached, the memory modules A1 and B1 perform the decoding process together without clearing the memory module C1, but the subsequently input data may overwrite the data originally stored in the memory module A1. According to the above manner, the memory modules {A1, B1}, the memory modules {B1, C1}, and the memory modules {C1, A1} are circularly operated, so as to implement the trace forward convergence decoding process or the trace forward convergence decoding process.

Figure 5:
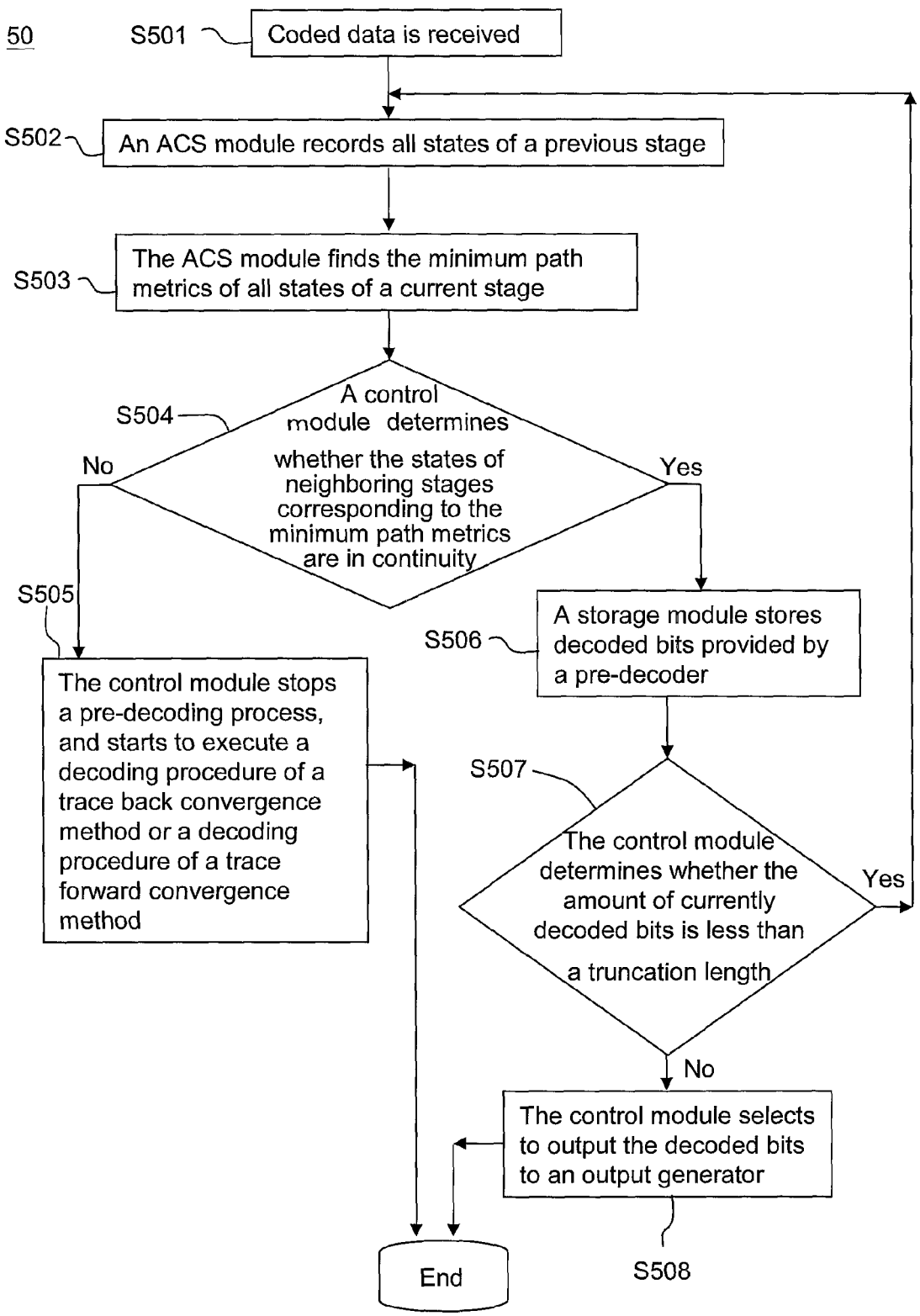
FIG. 5 is a flowchart of a TBCC decoding method according to an exemplary embodiment of the disclosure.

FIG. 5 is a flowchart of a TBCC decoding method 50 according to an exemplary embodiment of the disclosure. Referring to FIG. 1A and FIG. 5, the TBCC decoding method 50 is adapted for demodulating the TBCC, and includes the following steps. The TBCC decoding method 50 starts from step S501. In the step S501, the ACS module 111 is connected to the input interface 10, and the input interface 10 receives the received sequential data.

In step S502, the ACS module 111 records all states of a previous stage.

In step S503, the ACS module 111 finds the minimum path metrics of all states of a current stage.

In step S504, the pre-decoder 114 determines a legal path, that is, the pre-decoder 114 determines whether the states of the neighboring stages corresponding to the minimum path metrics are in continuity. If in step S504, the pre-decoder 114 determines that the states of the neighboring stages corresponding to the minimum path metrics are in continuity, after the step S504, a step S506 is performed. On the contrary, if in the step S504, the pre-decoder 114 determines that the states of the neighboring stages corresponding to the minimum path metrics are not in continuity, after the step S504, a step S505 is performed In the step S505, the control module 116 stops the pre-decoder 114, and starts to execute the decoding process of the trace back convergence method or the decoding process of the trace forward convergence method of the conventional art.

In the step S506, the storage module 115 stores the (expected or predicted) decoded bits provided by the pre-decoder 114.

In step S507, the control module 116 determines whether the amount of currently decoded bits is less than the truncation length. In other words, the control module 116, in the step S507, determines whether the accumulated number of states of the neighboring stages corresponding to the minimum path metrics being in continuity is less than the truncation length. If, in the step S507, the control module 116 determines that the amount of the currently decoded bits is less than the truncation length, after the step S507, the step S502 is performed. On the contrary, if, in the step S507, the control module 116 determines that the amount of the currently decoded bits is greater than or equal to the truncation length, after the step S507, a step S508 is performed. In other words, if the control module 116, in the step S507, determines the accumulated number of states of the neighboring stages corresponding to the minimum path metrics being in continuity is greater than or equal to the truncation length, then the step S508 is executed after the step S507.

In the step S508, the control module 116 selects to output the (predicted) decoded bits to the output generator 117. In addition, between the step S507 and the step S508, the control module 116 uses a counter (not shown) to count whether the continuously successful pre-decoding times reach the times corresponding to the truncation length, for example, 32 times (the reason is that in the radix-4 architecture, the decoded bits having the length of 2 bits are stored at each time of the pre-decoding). If the continuously successful pre-decoding times reach the times corresponding to the truncation length, the control module 116 directly outputs the (predicted) decoded bits to the output generator 117 from the register of the storage module 115.

The TBCC decoding method 50 is ended after the step S505 or the step S508. The step S501 to the step S508 may be repeatedly performed, and the TBCC decoding method 50 may also be applicable to the TBCC decoders 13 and 14 as shown in FIG. 1B and FIG. 1C.

Figure 6:
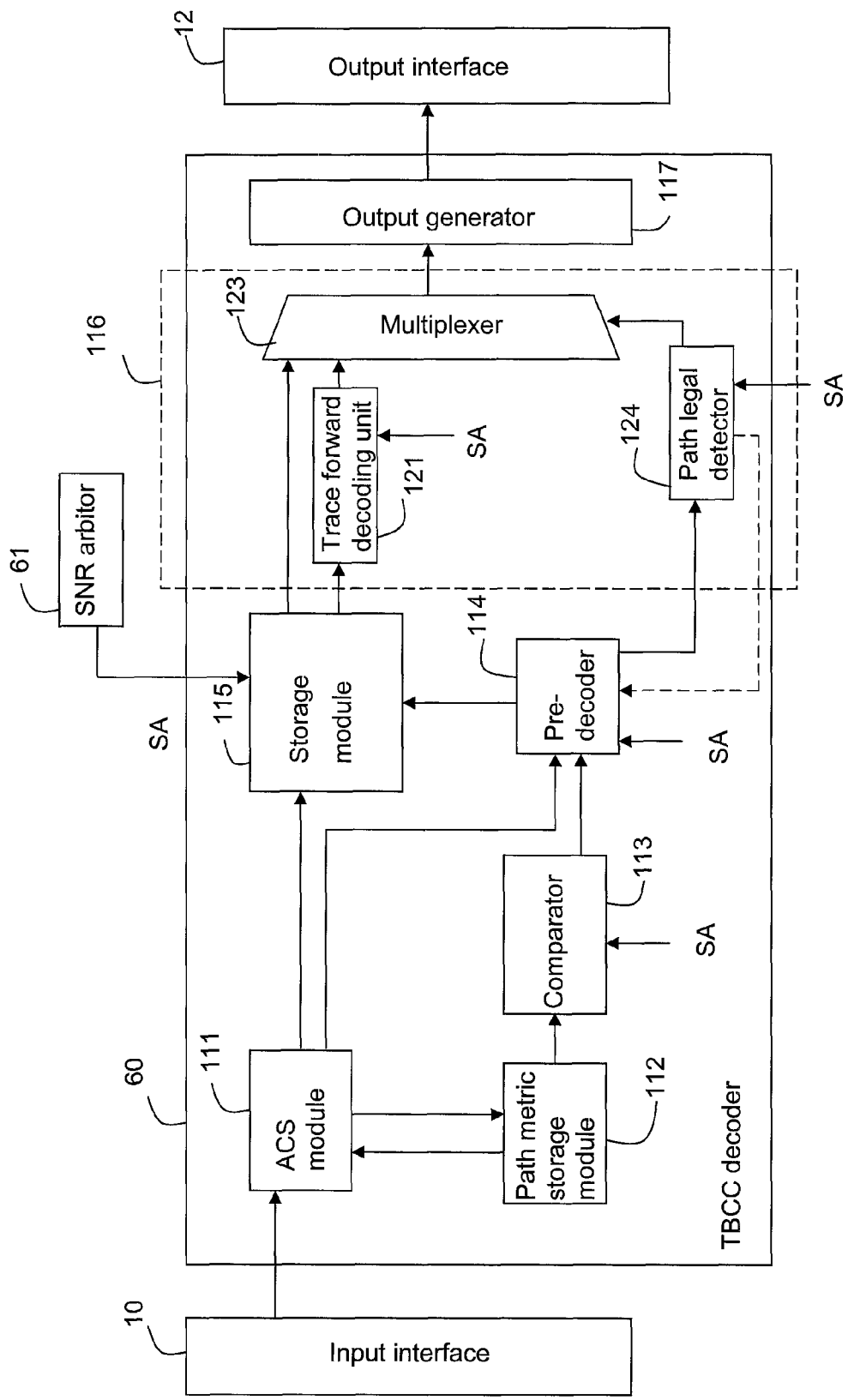
FIG. 6 is a block diagram of another TBCC decoder according to another exemplary embodiment of the disclosure.

FIG. 6 is a block diagram of another TBCC decoder 60 according to another exemplary embodiment of the disclosure. The TBCC decoder 60 is similar to the TBCC decoder 11, 13, and 14 as shown in FIG. 1A to FIG. 1C. The TBCC decoder 60 further includes a signal-to-noise ratio (SNR) arbiter 61, connected to the trace forward decoding unit 121, the path legal detector unit 124, the pre-decoder 114, and the storage module 115. Further, the SNR arbiter 61 provides a control signal SA to the trace forward decoding unit 121, the path legal detector unit 124, the pre-decoder 114, and the storage module 115, so as to notify the modules or units whether the current SNR is high, normal, or low.

However, the disclosure is not limited to the above, in other embodiments, the trace forward decoding unit 121 of the TBCC decoder 60 may be replaced by the trace forward decoding unit 122. In addition, when the SNR arbiter 61 determines that the current SNR is high, the path legal detector unit 124 directly selects to output the decoded bits (generated in the pre-decoding process) to the output generator 117 from the storage module 115; when the SNR arbiter 61 determines that the current SNR is normal, the path legal detector unit 124 selects to use the pre-decoder 114 to determine whether the states of the neighboring stages corresponding to the minimum path metric are in continuity; when the SNR arbiter 61 determines that the current SNR is low, the path legal detector unit 124 may directly change to use the trace forward decoding unit 121 to perform the decoding process, or change to use the trace forward decoding unit 122 to perform the decoding process in other embodiments.

Figure 7:
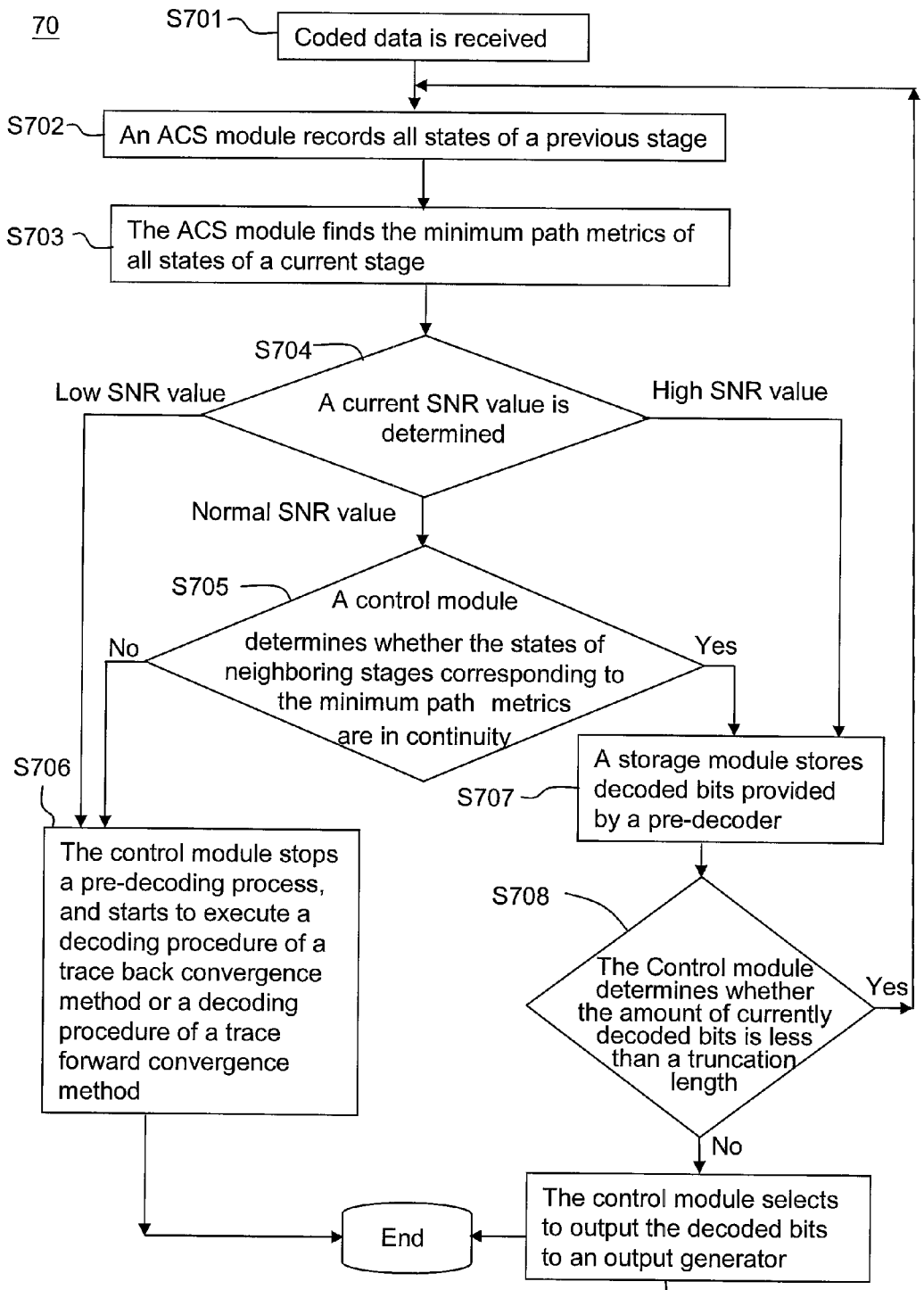
FIG. 7 is a flowchart of another TBCC decoding method according to another exemplary embodiment of the disclosure.

FIG. 7 is a flowchart of another TBCC decoding method 70 according to another exemplary embodiment of the disclosure. Referring to FIG. 6 and FIG. 7, the TBCC decoding method 70 is adaptable for demodulating the TBCC, and includes step S701 to step S709. The TBCC decoding method 70 starts from the step S701, the step S701 to step S703 are respectively similar to the step S501 to the step S503 in FIG. 5, step S706 is similar to the step S505 in FIG. 5, and the step S707 to step S709 are respectively similar to the step S506 to the step S508 in FIG. 5. Therefore, the technical features of the steps S701-S703 and steps S706-S709 may be referred FIG. 5, and are not described again here.

The TBCC decoding method 70 is different from the TBCC decoding method 50 in that the current SNR value (level) is determined in step S704 by the SNR arbiter 61. If, in the step S704, the SNR arbiter 61 determines that the current SNR value is high (or a high SNR value), after the step S704, the step S707 is performed. If, in the step S704, the SNR arbiter 61 determines that the current SNR value is normal (or a normal SNR value), after the step S704, the step S705 is performed. If in the step S704, the SNR arbiter 61 determines that the current SNR value is low (or a low SNR value), after the step S704, the step S706 is performed.

In the step S705, the pre-decoder 114 determines whether the states of the neighboring stages corresponding to the minimum path metrics are in continuity. If, in the step S705, the pre-decoder 114 determines that the states of the neighboring stages corresponding to the minimum path metrics are in continuity, after the step S705, the step S707 is performed. On the contrary, if in the step S705, the pre-decoder 114 determines that the states of the neighboring stages corresponding to the minimum path metrics are not in continuity, after the step S705, the step S706 is performed.

The TBCC decoding method 70 is ended after the step S706 or the step S709. The step S701 to the step S709 may be repeatedly performed. After the TBCC decoder and the corresponding TBCC decoding method are introduced, the path convergence probability of the TBCC decoder according to the disclosure is illustrated in Table I, and the corresponding required trace back convergence decoding times are illustrated in Table II.

TABLE I

| | Path Convergence Probability | | | | |
|---|---|---|---|---|---|
| Path Convergence Distribution State | BER Value of TBCC on Input End | $3.7 \times 10-2$ | $2.2 \times 10-2$ | $1.2 \times 10-2$ | $6 \times 10-3$ |
| | BER Value of TBCC on Output End | $5.5 \times 10-3$ | $2.9 \times 10-5$ | N/A | N/A |
| | Path Convergence Probability of Stage 1 | 93.6% | 96.78% | 98.48% | 99.34% |
| | Path Convergence Probability of Stage 2 | 3.1% | 2.1% | 1.1% | 0.057% |
| | Path Convergence Probability of Stage 3 | 0.13% | 0.05% | 0.018% | 0.0039% |
| | Convergence Status in 3 Stages | 97% | 98.9% | 99.7% | 99.9% |

Table I respectively shows the path convergence probabilities of stage 1, stage 2, and stage 3. The first row of Table I respectively shows the Bit-error-rate (BER) values of the TBCC of the input end. The second row respectively shows the BER values of the TBCC of the output end. The third to the fourth rows respectively show the path convergence probabilities corresponding to the different BER values of the TBCC of the input end. As shown in Table 1, in one stage, the probability of achieving the path convergence is increased with the bit error rate (BER) value of the input end. The last row shows the convergence status in the 3 stages, even under the status of the worst BER value of the input end, the probability of achieving the path convergence in three stages is approximately 97%.

TABLE II

Required Trace Back Convergence Decoding Times

| | QPSK (1/2) | QPSK (3/4) | 16QAM (1/2) | 16QAM (3/4) | 64QAM (1/2) | 64QAM (3/4) |
|---|---|---|---|---|---|---|
| Trace Back Convergence Decoding | 1546 | 2397 | 1378 | 2052 | 2571 | 2063 |

The simulation result shown in Table 2 is performed in an OFDM system of a fixed point. The relevant simulation environment parameters are as follows: the multipath $T_{rms}$ is 50 ms; the frequency deviation is 40 ppm; the time deviation is 40 ppm. The simulation uses 1,000 frames, and each frame has 1,000 bytes. The simulation environment is a quite poor wireless communication environment, usually when the TBCC decoding process is performed through the conventional art, the required trace back convergence decoding times are 11,947.

Table II respectively shows that under the status of different symbol demodulation technologies, for example, Quadrature Phase-Shift Keying (QPSK), Quadrature Amplitude Modulation having 16 points of possible positions (16-QAM), and Quadrature Amplitude Modulation having 64 points of possible positions (64-QAM), and different coding rates, the trace back convergence decoding times required by the pre-decoded TBCC are distinctly less than the trace back convergence decoding times required by the conventional art. For example, the trace back convergence decoding times required by the pre-decoded TBCC are approximately just ⅕-⅙ of the trace back convergence decoding times required by the conventional art. In addition, the frequency of accessing the memory having the large area may be reduced, for example, approximately ⅘-⅚ of the frequency of accessing the memory may be saved. Therefore, the pre-decoded TBCC decoder can reduce the overall power consumption, and also save the decoding time.

In summary, the exemplary embodiments of the disclosure provide the pre-decoded TBCC decoder and the decoding method thereof. The pre-decoder is allocated inside the TBCC decoder, along with a decoding architecture, and through the fixed specific relations between the pre-state and the current state of the convolutional code, it is determined whether the pre-decoding process is successful. Accordingly, the frequency of accessing memory may be effectively reduced, the overall power consumption of the TBCC decoder is reduced, and the decoding time is saved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pre-decoded tail-biting convolutional code decoder, comprising:
   a pre-decoder, configured for receiving a current state, a neighboring state, and a current path status corresponding to sequential data, generating at least one predicted decoded bit, and determining whether a first state corresponding to a minimum path metric of a current stage and a second state corresponding to a minimum path metric of a neighboring stage are in continuity according to the neighboring state, the current state, and the current path status, wherein the neighboring stage is a previous stage of the current stage, or a next stage of the current stage;
   a storage module, connected to the pre-decoder, configured for storing the predicted decoded bit; and
   a control module, connected to the storage module and the pre-decoder, wherein when the continuity between the first state corresponding to the minimum path metric of the current stage and the second state corresponding to the minimum path metric of the neighboring stage reaches a truncation length, the control module selects to output the at least one decoded bit from the storage module.

2. The decoder according to claim 1, wherein the control module receives a signal-to-noise ratio (SNR) value provided by an SNR arbitor, wherein
   when a current SNR value is high, the control module directly selects to output the at least one decoded bit from the storage module; and
   when the current SNR value is normal, the pre-decoder further determines whether the first state corresponding to the minimum path metric of the current stage and the second state corresponding to the minimum path metric of the neighboring stage are in continuity.

3. The decoder according to claim 2, wherein the control module comprises a trace back decoding unit, connected to the storage module, wherein when the first state corresponding to the minimum path metric of the current stage and the second state corresponding to the minimum path metric of the neighboring stage are not in continuity, the control module stops the pre-decoder, and selects the trace back decoding unit to decode the sequential data.

4. The decoder according to claim 2, wherein the control module comprises a trace forward decoding unit, connected to the storage module, wherein when the first state corresponding to the minimum path metric of the current stage and the second state corresponding to the minimum path metric of the neighboring stage are not in continuity, the control module stops the pre-decoder, and selects the trace forward decoding unit to decode the sequential data.

5. The decoder according to claim 3, wherein when the current SNR value is low, the control module selects the trace back decoding unit to decode the sequential data.

6. The decoder according to claim 4, wherein when the current SNR value is low, the control module selects the trace forward decoding unit to decode the sequential data.

7. The decoder according to claim 1, further comprising:
   a control selection module, connected to the storage module and the pre-decoder, configured for selecting and providing the current state, the neighboring state, and the current path status corresponding to the sequential data to the pre-decoder according to the sequential data, and selecting and storing data of a suivival path of each state in the storage module according to the sequential data.

8. The decoder according to claim 7, wherein the pre-decoder receives the current state, a pre-state, and the current path status corresponding to the sequential data, and determines whether the first state corresponding to the minimum path metric of the current stage and the second state corresponding to the minimum path metric of the neighboring stage are in continuity according to the current state, the pre-state, and the current path status.

9. The decoder according to claim 7, wherein the pre-decoder receives the current state, a next state, and the current path status corresponding to the sequential data, and determines whether the first state corresponding to the minimum path metric of the current stage and the second state corresponding to the minimum path metric of the neighboring stage are in continuity according to the current state, the next state, and the current path status.

10. The decoder according to claim 8, wherein when the pre-decoder comprises an architecture of radix-2k butterfly operation units, the highest k bits of the pre-state are possible path values, and the lowest k bits of the current state are the predicted decoded bits, wherein k is a positive integer.

11. The decoder according to claim 9, wherein when the pre-decoder comprises an architecture of radix-2k butterfly operation units, the highest k bits of the current state are possible path values, and the lowest k bits of the next state are the predicted decoded bits, wherein k is a positive integer.

12. A pre-decoded tail-biting convolutional code decoding method, comprising:
receiving a current state, a neighboring state, and a current path status corresponding to sequential data;
generating at least one predicted decoded bit;
determining whether a first state corresponding to a minimum path metric of a current stage and a second state corresponding to a minimum path metric of a neighboring stage are in continuity according to the neighboring state, the current state, and the current path status;
storing the at least one predicted decoded bit; and
selecting to output the at least one predicted decoded bit stored previously when the continuity between the first state corresponding to the minimum path metric of the current stage and the second state corresponding to the minimum path metric of the neighboring stage reaches a truncation length.

13. The method according to claim 12, further comprising:
receiving a signal-to-noise ratio (SNR) value provided by an SNR arbitor;
directly selecting to output the at least one decoded bit stored previously when a current SNR value is high; and
determining whether the states of the neighboring stages corresponding to the minimum path metrics are in continuity when the current SNR value is normal.

14. The method according to claim 13, wherein when the first state corresponding to the minimum path metric of the current stage and the second state corresponding to the minimum path metric of the neighboring stage are not in continuity, the control module stops the pre-decoder, and selects to decode the sequential data through a track back decoding method.

15. The method according to claim 13, wherein when the first state corresponding to the minimum path metric of the current stage and the second state corresponding to the minimum path metric of the neighboring stage are not in continuity, the control module stops the pre-decoder, and selects to decode the sequential data through a track forward decoding method.

16. The method according to claim 14, wherein when the current SNR value is low, the control module selects to decode the sequential data through the track back decoding method.

17. The method according to claim 15, wherein when the current SNR value is low, the control module selects to decode the sequential data through the track forward decoding method.

18. The method according to claim 12, wherein in the step of determining whether the first state corresponding to the minimum path metric of the current stage and the second state corresponding to the minimum path metric of the neighboring stage are in continuity according to the neighboring state, the current state, and the current path status, the method further comprises:
determining whether the first state corresponding to the minimum path metric of the current stage and the second state corresponding to the minimum path metric of the neighboring stage are in continuity according to the current state, a pre-state, and the current path status.

19. The method according to claim 12, wherein in the step of determining whether the first state corresponding to the minimum path metric of the current stage and the second state corresponding to the minimum path metric of the neighboring stage are in continuity according to the neighboring state, the current state, and the current path status, the method further comprises:
determining whether the first state corresponding to the minimum path metric of the current stage and the second state corresponding to the minimum path metric of the neighboring stage are in continuity according to the current state, a next state, and the current path status.

20. The method according to claim 18, wherein when the current state, the pre-state, and the current path status corresponding to the sequential data are obtained through a processing module having an architecture of radix-2k butterfly operation units, the highest k bits of the pre-state are possible path values, and the lowest k bits of the current state are the predicted decoded bits, wherein k is a positive integer.

21. The method according to claim 19, wherein when the current state, the next state, and the current path status corresponding to the sequence data are obtained through a processing module having an architecture of radix-2k butterfly operation units, the highest k bits of the current state are possible path values, and the lowest k bits of the next state are the predicted decoded bits, wherein k is a positive integer.

* * * * *